United States Patent [19]

Germer et al.

[11] Patent Number: 5,059,896
[45] Date of Patent: Oct. 22, 1991

[54] ELECTRONIC WATTHOUR METER

[75] Inventors: Warren R. Germer, Dover, N.H.; Maurice J. Ouellette, North Berwick, Me.; Mehrdad N. Hagh; Bertram White, both of Irvine, Calif.

[73] Assignee: General Electric Company, Somersworth, N.H.

[21] Appl. No.: 412,359

[22] Filed: Sep. 25, 1989

[51] Int. Cl.⁵ .......................................... G01R 21/133
[52] U.S. Cl. ................................... 324/142; 324/115; 324/116; 324/141; 324/483
[58] Field of Search ............... 324/115, 116, 141, 142, 324/95, 130; 364/483, 492; 341/139, 156, 157

[56] References Cited

U.S. PATENT DOCUMENTS

| | | | |
|---|---|---|---|
| 4,131,847 | 12/1978 | Kohga et al. | 324/142 |
| 4,342,983 | 8/1982 | Weigand et al. | 341/156 |
| 4,734,639 | 3/1988 | Saletta et al. | 324/115 |
| 4,758,962 | 7/1988 | Fernandes | 364/483 |
| 4,761,606 | 8/1988 | Germer et al. | 324/116 |
| 4,806,855 | 2/1989 | Davis | 364/483 |
| 4,837,504 | 6/1989 | Baer et al. | 324/116 |
| 4,870,351 | 9/1989 | Milkovic | 324/142 |
| 4,884,021 | 11/1989 | Hammond et al. | 324/116 |
| 4,893,124 | 1/1990 | Tsuji et al. | 341/156 |
| 4,933,631 | 6/1990 | Eccleston | 324/115 |
| 4,949,029 | 8/1990 | Cooper et al. | 324/130 |

Primary Examiner—Kenneth A. Wieder
Assistant Examiner—William J. Burns
Attorney, Agent, or Firm—Robert E. Brunson

[57] ABSTRACT

An electronic watthour meter is digitally configurable to operate as several different types of watthour meters for metering electrical energy from a variety of different electric utility services. Automatic scaling of line input currents is provided to scale the voltage input to an analog to digital converter over selected ranges such that low level and high level input signals are measured in an optimum range. A digital signal processor is employed to calculate values for metered electrical energy and output pulses, each proportional to a quantum of energy flowing in the circuit being metered. The processor calculates the value of DC offset errors inherent in the various analog circuits of the meter and uses that value in the calculation of metered electrical energy to compensate for such offset errors. The meter employs automatic and manually initiated test functions for testing the operation of the processor and other critical circuits in the meter.

16 Claims, 15 Drawing Sheets

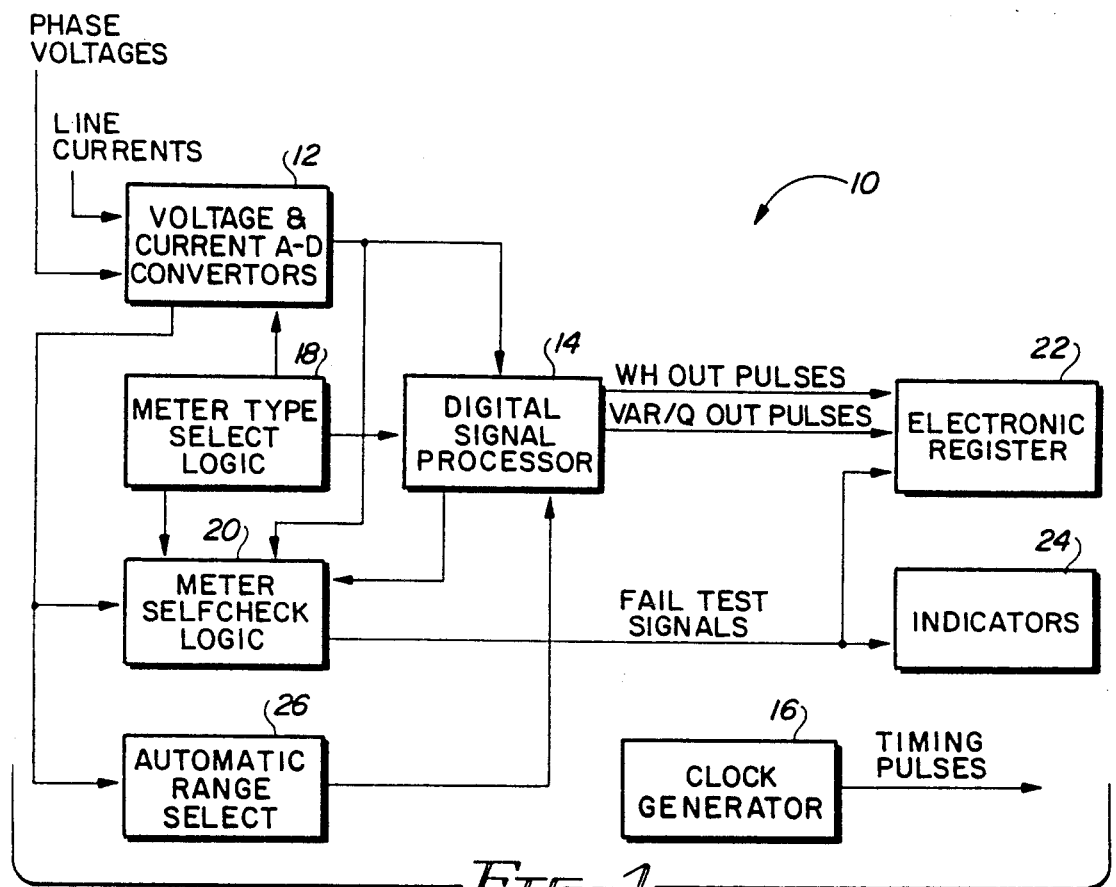
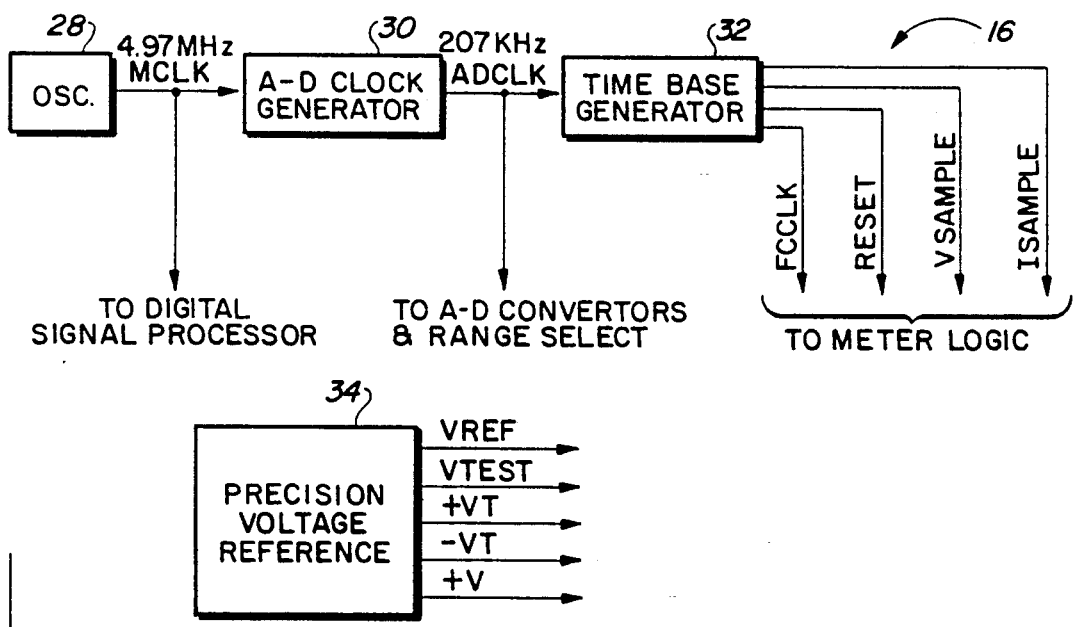

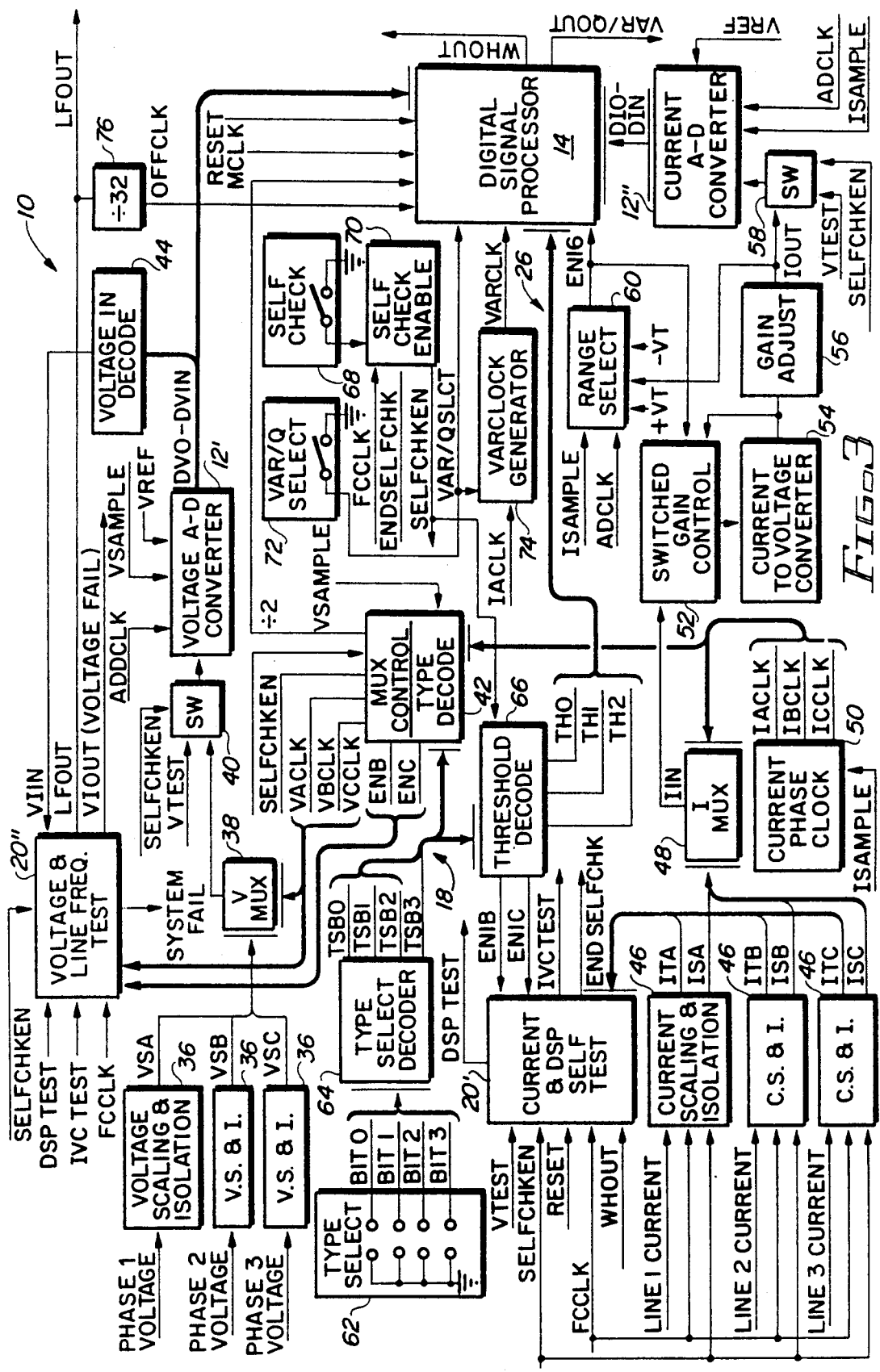

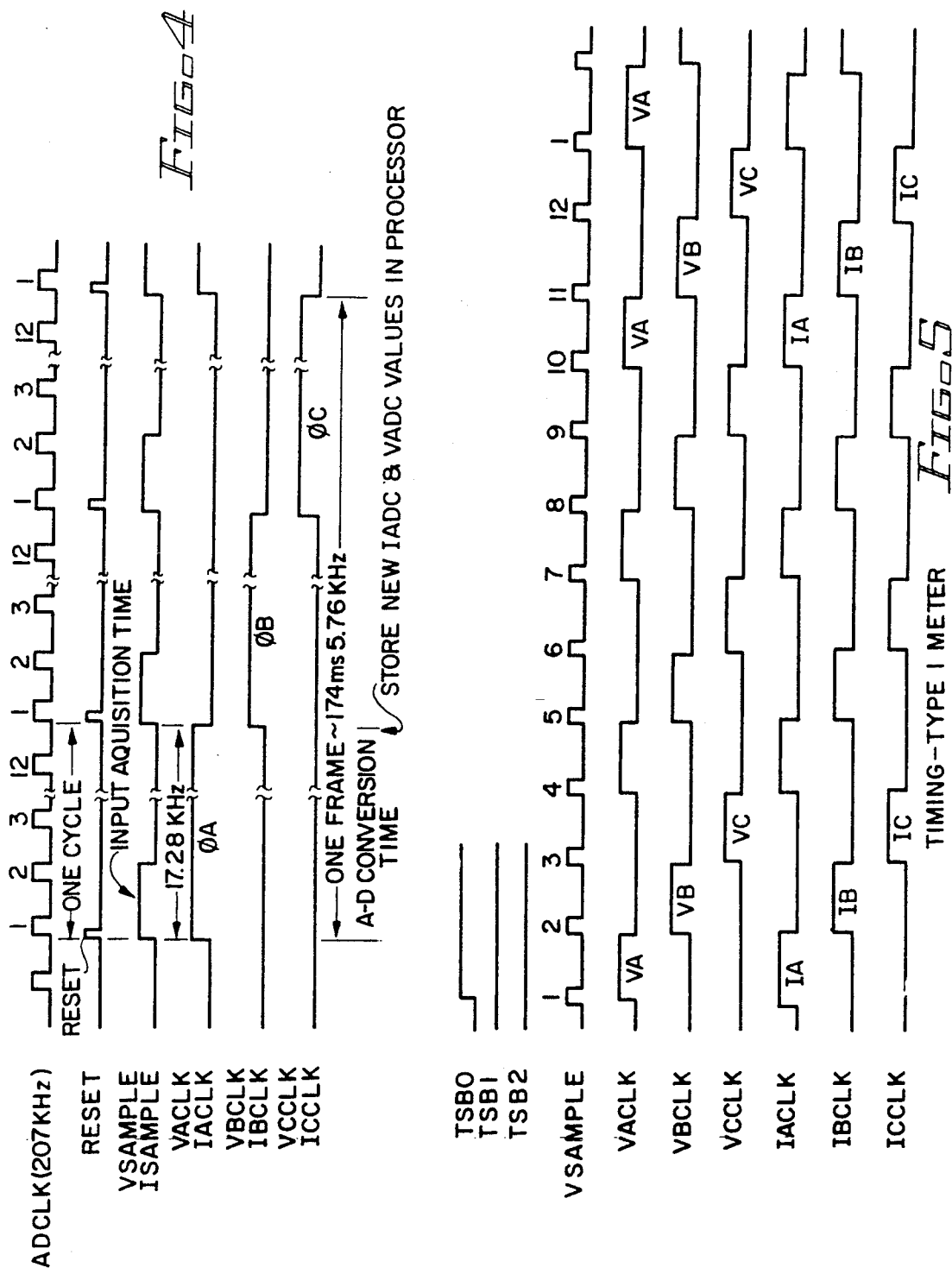

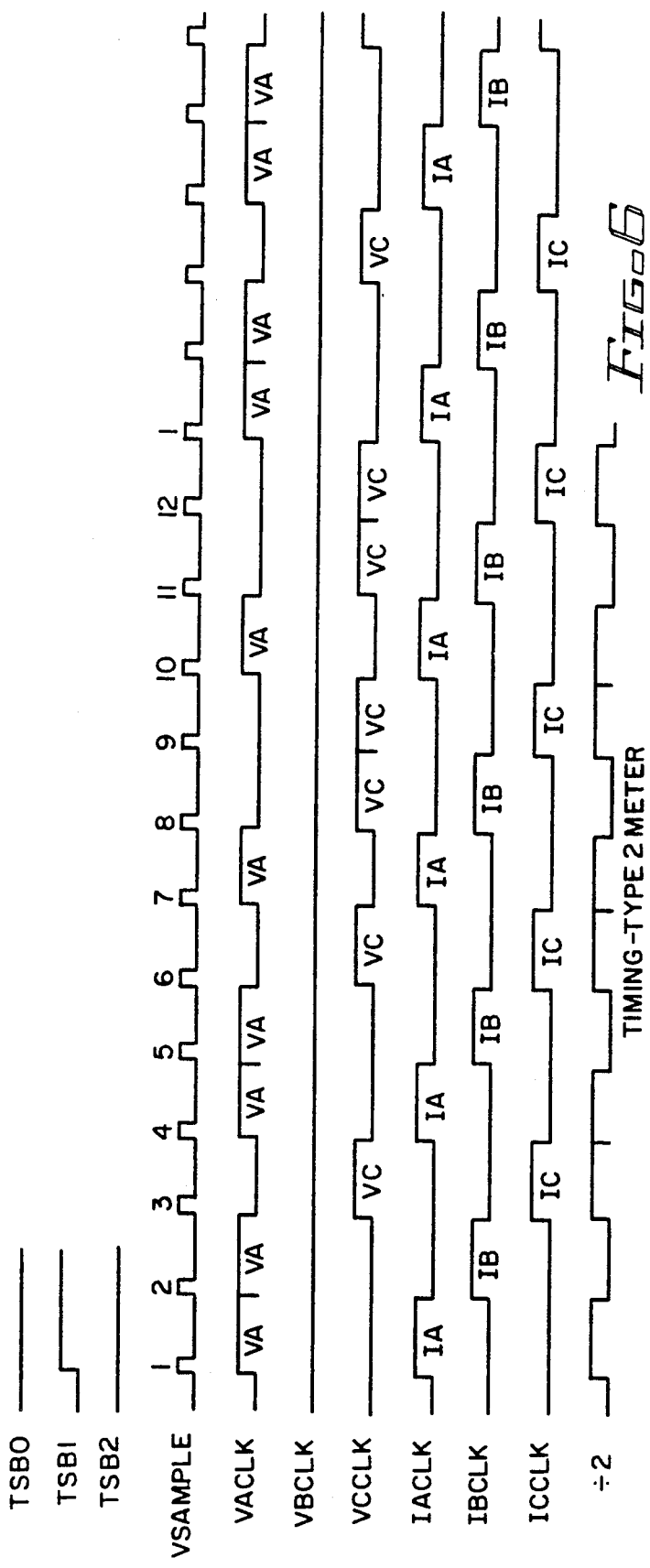

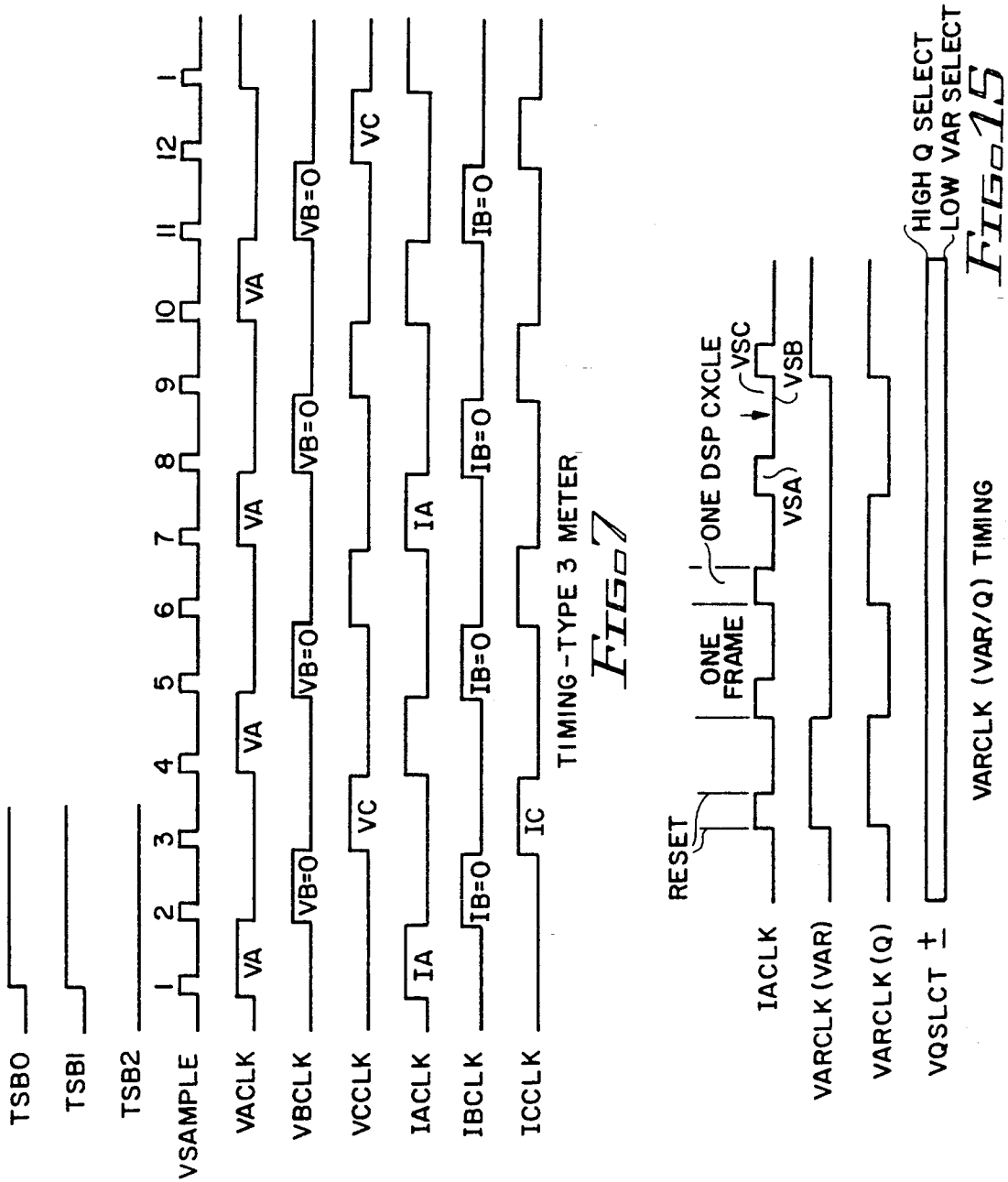

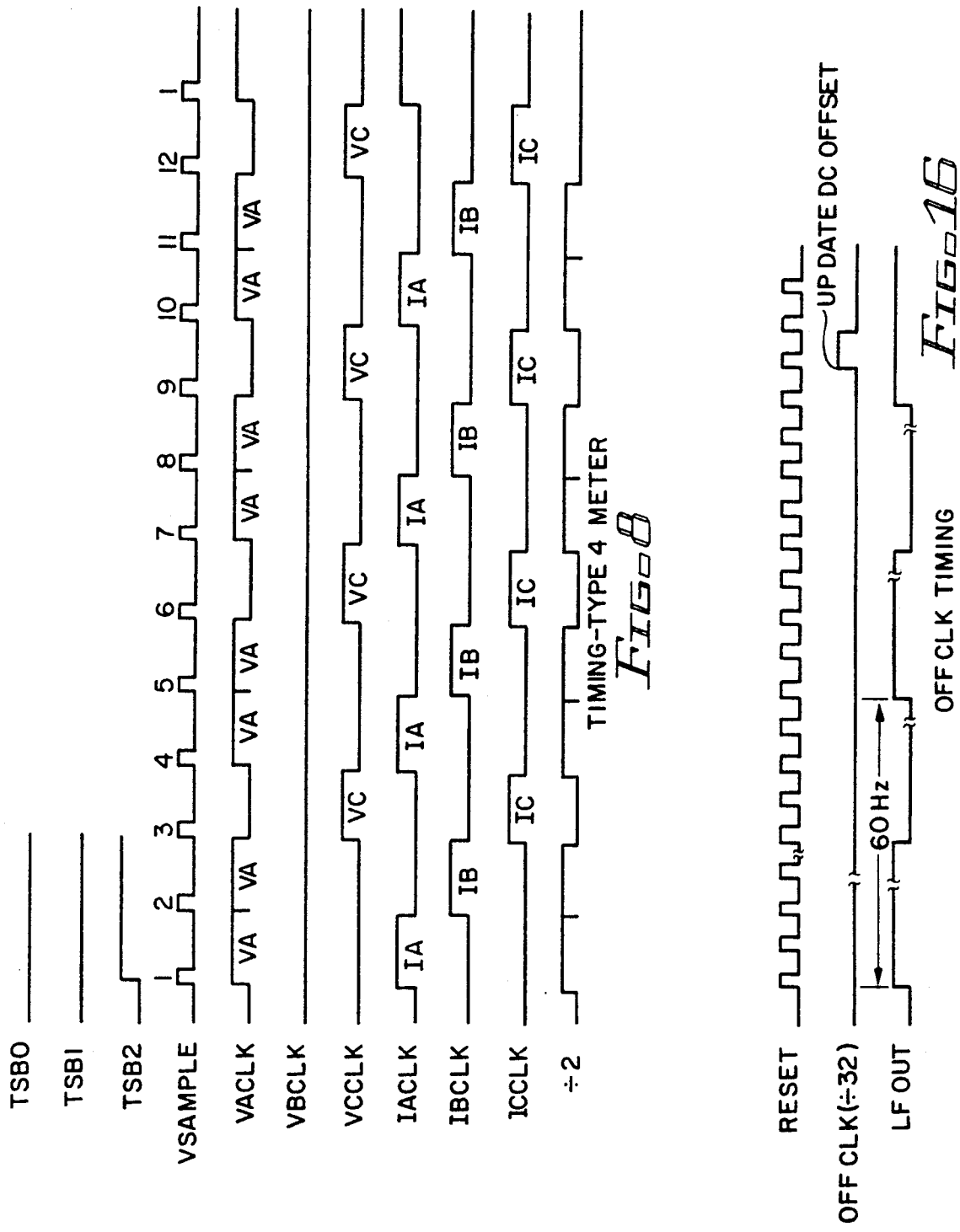

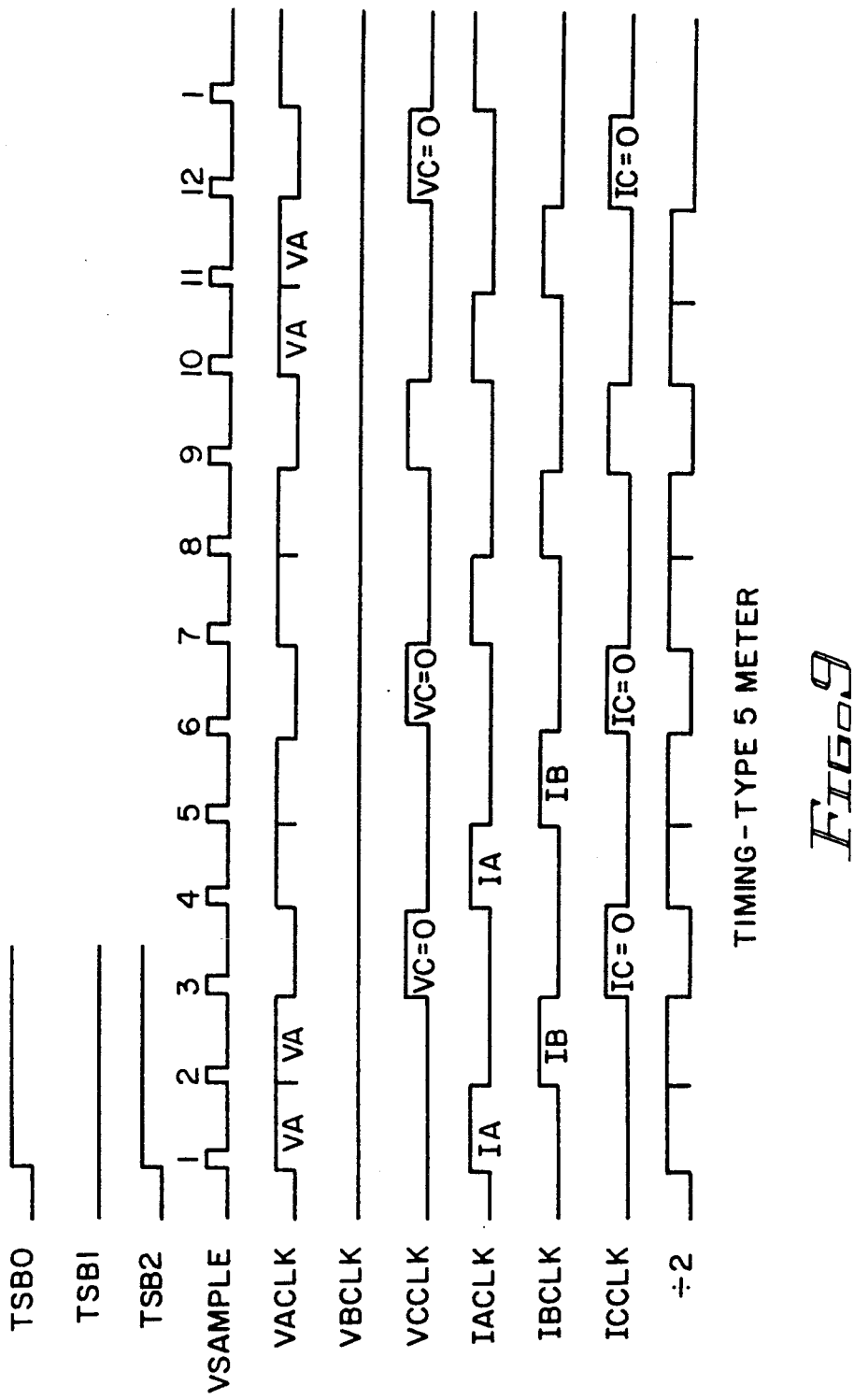

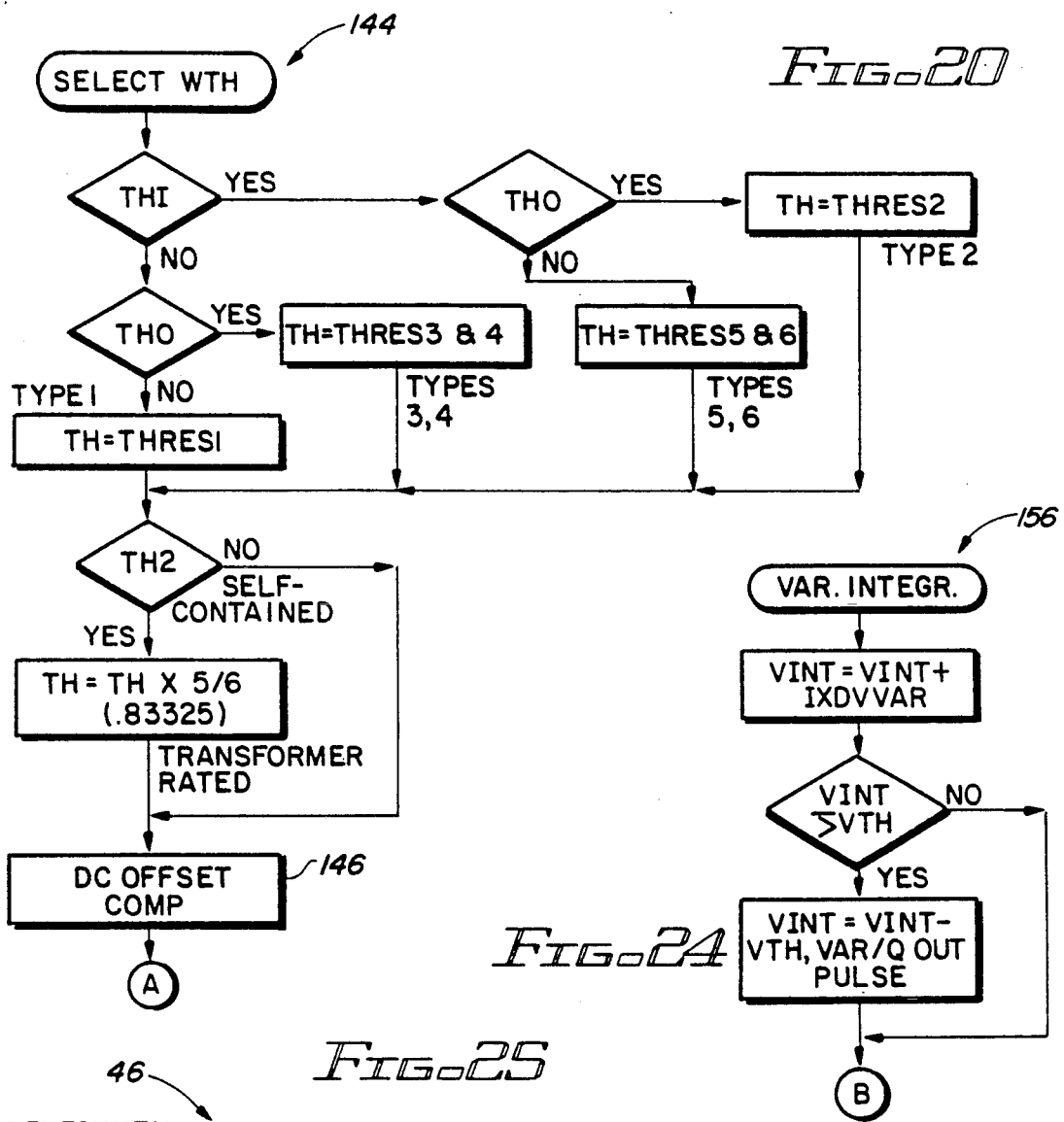
FIG. 20
FIG. 24
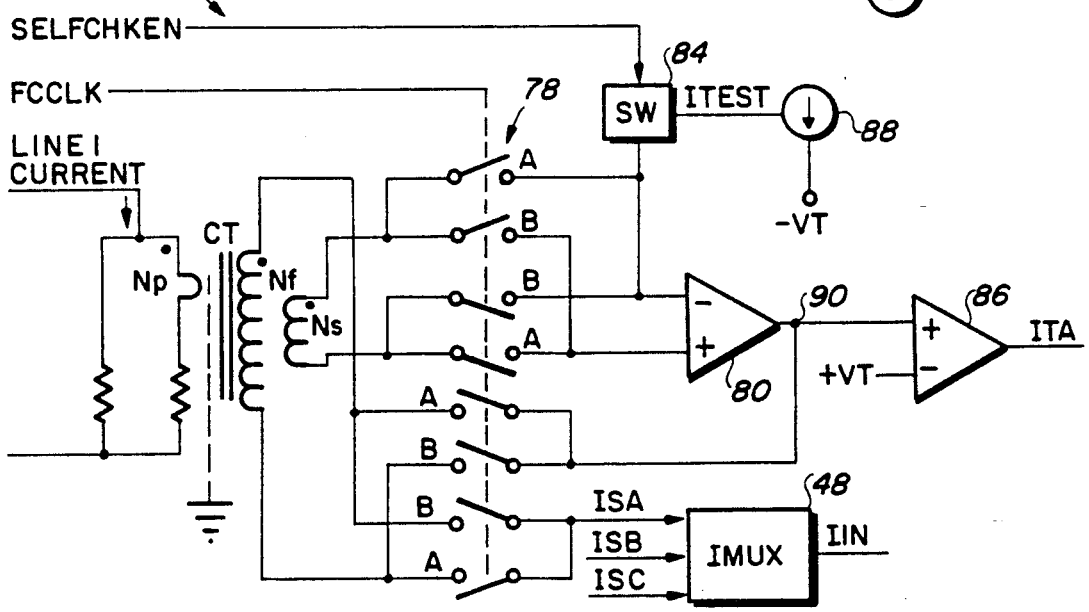
FIG. 25

ELECTRONIC WATTHOUR METER

BACKGROUND OF THE INVENTION

The present invention relates to electronic watthour meters and more particularly to techniques and apparatus therein for configuring a meter to monitor electrical energy consumption on various types of service networks and further to such a meter which contains apparatus for improving the accuracy of the measurement of electrical energy.

It is well known that there are several different types of electrical distribution systems or service in common use today. These systems provide power to a user facility in the form of:
1. a four wire three phase wye service;
2. a three wire three phase delta;
3. a three wire network;
4. a four wire three phase delta service;
5. a three wire single phase service; and
6. a two wire single phase service.

Historically the monitoring of electrical energy consumption by a load which is connected to these services has been done by various types of induction type watthour meters designed specifically to be connected to these types of services. Meters must be configured so as to be properly connected to each of the different types of services. Unfortunately, two variants of each basic meter type are required, differing primarily by their full scale current rating. The so called self-contained watthour meter in common use today has a full scale current rating of 200 amperes. The second type of commonly used meter is called a transformer-rated meter (used with external current transformers to scale down their large current loads) and has a full scale current rating of 20 amperes. In the historical development of electromechanical or induction type meters, the self-contained and transformer-rated meters wound up with slightly different watthour constants (watthours per disc revolution). Therefore, the two different types of meters cannot be provided for in just the scale factor alone of the current sensor in the meter which is used to sense the line currents. Thus it can be seen that a need exists for a watthour meter which can be configured to accommodate the various types of distribution systems or electrical services.

Electronic registers are in common use today with induction type watthour meters. Typically the induction type watthour meter contains a pulse initiator which senses rotation of the meter disc and provides pulses proportional to energy consumption to the register. These electronic registers are typically used for the measurement of kilowatt demand and/or time of use energy consumption. In order to accumulate data representative of these types of consumption, a time base is usually required. This time base is used for interval timing of typically 5, 15, 30 or 60 minutes for calculation of kilowatt demand and for keeping time and date information in time of use meters.

Whenever an electronic register is employed with an induction type meter, generally one phase voltage is supplied to the register to provide both power to operate the register and also the line frequency for the time base. If that particular phase voltage fails, the register will cease operation. However, on polyphase induction type meters there may be up to two other phase voltages supplied to the meter. If the phase voltage supplying the 60 Hz time base to the register fails, the meter disc will continue to rotate due to the other two active phases, but the electronic register will not operate normally even if powered. Thus it can be seen that a need exists to be able to provide the line frequency time base to an electronic register from a meter if any one phase voltage is available at the meter voltage input.

For induction type meters, particularly of the transformer-rated type, it has been the practice for many years to provide "pot lamps" to indicate potential or the presence of voltage at each of the meter potential inputs. Typically, these pot lamps are energized from a secondary winding on each meter potential coil, and indicate that flux is being delivered to the meter disc. These pot lamps can also be used to indicate the presence of each of the phase voltages at the input to the meter. In earlier watthour meters these pot lamps were first incandescent bulbs (one per voltage input) and more recently these meters utilize light emitting diodes. Each of these devices draw significant power, has limited life, emits light (a target for vandalism) and is difficult to see in high ambient light conditions. Meter readers typically are expected to check each of the lamps at each monthly reading and report any problem if a lamp is not operating. Thus it can be seen that a problem will never be identified unless a meter reader or some other knowledgeable person is present at the time of loss of potential of any of the inputs to the meter. In this context, it can be seen that a need exists for insuring integrity of the potential circuits in an electronic meter down to a level at least comparable to that in induction type watthour meters while overcoming most of the shortcomings of the induction type meter.

In electricity metering, electric utility companies historically have found it desirable to measure, in addition to total kilowatt-hours (real volt amperes), power factor, KVA, or reactive volt amperes. The measurement of reactive volt amperes typically has been accomplished by using a second meter in conjunction with the conventional kilowatt-hour meter. From the reactive volt amperes and the real volt amperes, quantities such as power factor and KVA can be calculated. This second meter for measurement of reactive volt amperes, is in actuality a watthour meter connected with phase shifting transformers in the voltage circuits. Voltage phase shifts of 90 degrees result in a measurement called Vars (reactive volt amperes). Voltage phase shifts of 60 degrees result in a different measurement generally called Q or Qhours. Q is in fact a reactive measurement and may have well evolved from the fact that the 60 degree phase shift could be readily accomplished by cross phasing the meter voltage connections to a polyphase circuit at the meter, thus eliminating the need of phase shifting transformers as is required for the measurement of Vars. The requirement to provide a second meter for making these reactive measurements is expensive by the mere fact that the second meter must be employed. Thus it can be seen that a need exists to provide a single meter which is capable of measuring both kilowatt-hours and reactive volt amperes without external phase shifting transformers or the need to make special connections.

For a detailed description pertaining to electricity metering and in particular for detailed information pertaining to the various types of electrical services and distribution systems and the types of meters utilized to perform kilowatt-hour, varhour and Qhour metering, reference is made to the Handbook for Electricity Metering, Eighth Edition, published by the Edison Electric Institute.

Electric utility companies have come to expect very high levels of reliability in the metering equipment they purchase from manufacturers. In electronic metering equipment in particular, it is important to be able to tell if a piece of equipment is good or has failed without the need to perform complex or time consuming test procedures or to remove the equipment from the installation. Thus it can be seen that a need exists to be able to quickly and easily verify proper operation of key elements or circuits in an electronic meter without complex or lengthy test procedures and without having to remove the equipment from service. Further a need exists to achieve this reliability and test capability with a low cost solution which does not substantially reduce the meter equipment reliability due to increased complexity of additional circuitry.

Electronic meters employ analog amplifiers, such as those used in analog to digital converters and current to voltage converters, as well as other types of circuits and components which can introduce DC offset voltages in the entire meter contributing to inaccuracy in the measurement of power. For example, a typical DC offset error voltage might typically be one millivolt, or worst case as large as 30 millivolts, in a low cost single chip integrated circuit for a complete watthour meter which is constructed from a CMOS process. There have been techniques developed for trimming out this DC offset in high performance single chip amplifiers of the aforementioned type, but they are not considered appropriate for the many amplifiers necessary to implement in an electronic meter such as that contemplated by the present invention. It is possible to build a suitable calibration means into an electronic meter which adjusts out the effects of DC offset at the time the meter is calibrated. However these offsets can drift with time, and more significantly with temperature, thus causing changes in the electronic meter accuracy. Meter accuracy versus time and temperature are both important to electrical utilities and have limits specified in national standards. Therefore it can be seen that it is desirable to provide a means to compensate for the accumulation of DC offsets in an electronic meter and which also adapts to any changes in the DC offset that might occur during the lifetime of the meter.

OBJECTS AND SUMMARY OF THE INVENTION

It is an object of the invention to provide an electronic watthour meter having enhanced operating capabilities.

It is a further object of the invention to provide an electronic watthour meter which provides the capability to digitally configure the meter to measure electric energy flow in any one of a plurality of different electrical services.

It is another object of the invention to provide an electronic watthour meter capable of measuring real power such as watthours and further capable of selectively measuring different reactive power components.

It is a still further object of the invention to provide an electronic watthour meter with automatic range switching capability which adjusts the input current provided to the meter over a prescribed range to achieve high accuracy over a wide dynamic range of input currents to thus reduce the number of current ratings required.

It is another object of the invention to provide an electronic watthour meter for providing a line frequency time base to an electronic register so long as any one phase voltage in a polyphase system is available at the meter voltage input.

It is a further object of the invention to provide an electronic watthour meter for monitoring the voltage potential input signals to the meter and providing an output signal to an electronic register indicative of a failure of one or more of the potential voltage input signals to the meter.

It is another object of the invention to provide an electronic watthour meter having manually initiated selfcheck capability for testing critical circuits within the electronic meter and providing output signals to various indicators and to an electronic register indicative of a failure in the meter.

It is a further object of the invention to provide an electronic meter capable of compensating for the accumulation of DC offset voltages in the meter and also which automatically adapts to any changes in the DC offsets that might occur during the lifetime of the meter.

In one aspect, the invention provides an electronic meter which can be digitally configured to measure electrical energy in two or three wire single phase services or circuits or three or four wire polyphase services or circuits such as generally provided by electric utilities. The meter is configured to be connected to either single phase or polyphase power line systems. A current multiplexor is utilized t combine the signals from individual line currents in each phase and a voltage multiplexor is used to combine the individual line voltage signals for each phase. As each phase (current and voltage) is sampled by its respective multiplexor, the current and voltage analog output signals from the respective multiplexors are fed to corresponding analog to digital converters for converting each multiplexed analog signal to an equivalent digital signal. The voltage and current output signals from the respective multiplexors are in fact voltage and current samples which can get converted in the respective analog to digital converters. Each analog sample is converted into a digital word in a register in the analog to digital converter which is transferred to a digital signal processor such as a microcomputer. These digital samples are representative of current and voltage respectively and are multiplied together in the digital signal processor and integrated over time to derive a measurement of energy.

A precision time base is maintained in the electronic meter and is utilized to generate the various timing signals for multiplexing of the phase voltage and line current input signals through the current and voltage multiplexors as well as the sample times for doing the analog to digital conversions for the voltage and current. A meter type select decode is utilized to configure the meter to measure energy in any one of the above mentioned power distribution systems or services. The output signals from the type select decoder are provided to a multiplex controller which decodes the signals to provide the proper phasing of clock signals to the voltage multiplexor to thus control the times of sampling of the various phase voltage inputs to the meter. The sequence by which the various phase voltage input signals are sampled is directly dependent upon how the meter has been configured for the type of service being metered.

As each current and voltage sample is converted to a digital equivalent, it is transferred to the digital signal processor where those samples are stored in respective current and voltage registers. At the end of each conversion the digital signal processor then multiplies the samples together to derive a measurement of instantaneous power which gets summed with previous measurements and accumulated in the processor. The accumulation of products gets compared against a threshold value or constant stored in the digital signal processor which corresponds to the type of meter configuration. When the accumulated value of the products is equal to the selected threshold value, the digital signal processor outputs a pulse representative of watthours to an electronic register. When the watthour pulse is sent to the electronic register, the value of the threshold is subtracted from the accumulated value.

The electronic watthour meter also provides a signal to the digital signal processor to notify the processor as to whether to calculate VARS or Q. Depending on whether the meter has been selected to function as a VAR meter or a Q meter, the digital signal processor will enter into a subroutine after its calculation of watthours, and calculate either Vars or Q values and output pulses proportional to these values to the register. The threshold values for Vars and Q are also set automatically by the digital signal processor dependent upon the type of meter configuration.

In another feature of the invention an electronic watthour meter provides an automatic ranging feature which scales the input current signals to be measured such that minimum signal levels will be more nearly comparable to large signal levels over a large range of input currents provided to the meter. Thus the total range over which the current measurement circuits must operate is reduced. At the beginning of each analog to digital conversion of the current, the magnitude of the current is tested to see if it falls above or below a specific range. Depending upon the magnitude of the current, the range select feature automatically switches to either a low current or a high current range. The analog to digital converter then converts the current to a digital value for transfer to the digital signal processor. The state of the high/low range select is stored in a range select memory which provides a signal to the digital signal processor along with the digitized current sample so that the digital signal processor can tell in which range the sample was taken. Armed with this information the digital signal processor is then enabled to convert samples taken in one scale to another scale for combining current quantities for use in deriving power measurements.

In another aspect of the invention an electronic meter continuously monitors all of the phase voltage inputs to the meter. These phase voltages are constantly monitored in a phase voltage decode which continuously provides a 60 hertz timing signal to an electronic register as a time base for that register. The phase voltage decode insures that the 60 hertz time base signal will be continuously provided to the electronic register so long as any one phase voltage is present. That is, two voltages in the polyphase system could be missing and the time base signal would still be presented to the electronic register. In accordance with another aspect of the invention a timer is associated in the electronic watthour meter with each voltage phase input signal provided to the meter. These timers are each driven by a timing clock signal which is synchronized with each of the phase voltages. Each of these timers will output a pulse at the end of a prescribed delay period. At the end of each analog to digital voltage conversion sample, a voltage decode tests to see if the magnitude of the converted voltage is at a prescribed minimum value. If the sampled input phase voltage is at or above the prescribed value the respective timer for that phase gets reset and thus the timer does not time out. However, at the time of the test, if the tested phase voltage is absent or below the prescribed value, the timer for that respective phase outputs on a pulse which gets transferred to an electronic register to indicate to the register that that particular phase has failed in the meter.

In another aspect of the invention an electronic meter incorporates a method for testing the operation of critical circuits which make up the electronic meter. The testing of these circuits may be initiated manually. The digital signal processor the voltage A-D converter and current A-D converter are tested for successful operation by applying known constant inputs and monitoring the watthour output pulses from the digital signal processor. If these output signals are not received within a prescribed time window, the meter of the present invention generates a DSP test fail signal which is then provided to an electronic register for display or to an indicator to indicate that there has been a failure of the digital signal processor. Additionally, means is provided for testing each of the line current input sensors. A current test fail signal is generated and sent to the electronic register and to an indicator to indicate that there has been a failure in one of the current sensing devices that provides input current to the meter. Further, means is provided in the present invention for combining the DSP test fail signal, the current test fail signal and the aforementioned voltage fail signal to generate a system fail signal which can be sent to an external indicator or to an electronic register to indicate that there has been a failure in the system.

As a further feature of the invention a method is employed in the digital signal processor for compensating for the effects of DC offset voltages which occur in the various circuits in the voltage analog to digital voltage conversion circuitry of the electronic meter. To carry out this compensation, the sum of all voltage samples (ie, A-D conversions) are taken and accumulated over a fixed number of cycles (eg, 60 Hertz) of the input voltage. The resulting sum of these voltage samples is then divided by the number of voltage samples taken during all of the analog to digital conversions carried out over the fixed number of cycles. This division results in an average DC offset value for each of the previous voltage samples, which is then subtracted from each subsequent voltage sample. The correction factor (or offset compensation value) is updated after each fixed number of cycles.

The above, and other objects, features and advantages of the present invention will become apparent from the following description read in conjunction with the accompanying drawings, in which like reference numerals designate the same elements.

BRIEF DESCRIPTION OF THE DRAWING

FIG. 1 is a simplified block diagram of an electronic meter of the present invention.

FIG. 2 is a block diagram illustrating the various timing signals and reference voltages applied in carrying out the invention.

FIG. 3 is a detailed logic block diagram of an electronic watthour meter according to an embodiment of the invention.

FIGS. 4-16 are timing diagrams illustrating timing relationships between various signals and are useful in understanding the construction and operation of the electronic watthour meter of the invention.

FIGS. 19-24 are program flow chart diagrams illustrating the operation of a digital signal processor for processing meter data and carrying out the operations of an electronic meter according to an embodiment of the invention.

FIG. 25 is a schematic block diagram of a line current test circuit for generating test fail signals during a self check operation

DESCRIPTION OF THE PREFERRED EMBODIMENT

Figure 10:
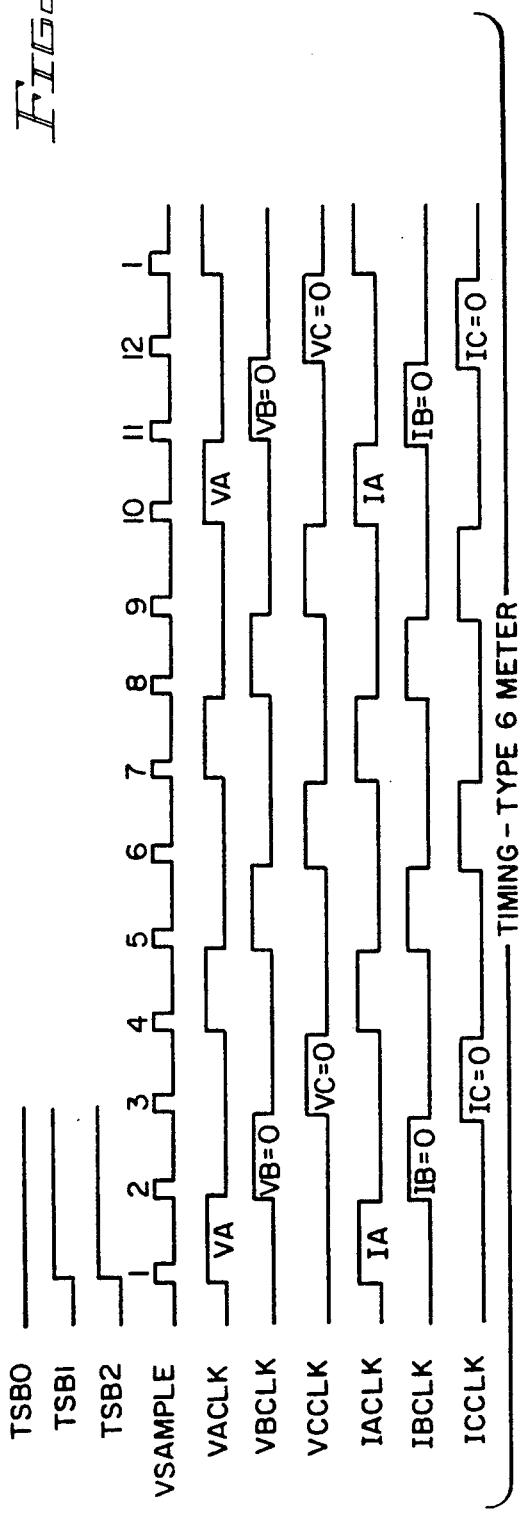

Reference is now made to FIG. 1, which is a major block diagram of an electronic watthour meter shown generally at 10 in accordance with the present invention. The Meter 10 is connected to a power distribution service or network and receives phase voltage inputs and line current inputs, which after having been scaled and isolated are provided to the input of two Voltage and Current Analog to Digital (A-D) Converters 12 for converting the voltage and line current inputs to corresponding digital output words which are provided to a Digital Signal Processor (DSP) 14. A Clock Generator 16 generates a plurality of timing pulses from a precision oscillator and provides those timing pulses to the various blocks of the meter for controlling the operations of the meter and the Processor 14. A Meter Type Select Logic 18 is utilized to provide various timing signals to the A-D Converters 12 and to the Digital Signal Processor 14 to control the operations thereof in accordance with the configuration of the meter selected by Select Logic 18 to correspond to the particular type of power service network to which the meter is connected. The Meter Type Select Logic 18 also provides control signals to a Meter Self Check Logic 20 along with outputs of the A-D Converters 12 to selectively effect the generation of fail test signals representative of various operational conditions taking place within the meter. These fail test signals are provided to a plurality of Indicators 24 for instantaneously showing the status of the meter and also to an Electronic Register 22 such as a demand register or time of use register. The Electronic Register may be programmed to monitor these fail test signals and display the status of those signals, for example, on a liquid crystal display for use by a meter reader in analyzing the condition of the meter. The A-D Converters 12 also provide digital words or signals proportional to phase voltages and line currents to the input of the Meter Self Check Logic 20 and to an Automatic Range Select 26. The Self Check Logic 20 monitors the signals proportional to the phase voltage inputs to continuously check on the condition of the voltage sensors and isolation networks feeding the voltages to the input of the voltage A-D Converter. The Automatic Range Select 26 continuously monitors signals proportional to line current inputs to the A-D Converters and, each analog to digital conversion period of the input currents, will provide a signal to the Digital Signal Processor 14, notifying it of the selected range of input current.

The Digital Signal Processor, in response to a reset or start signal from the Clock Generator 16 periodically reads the outputs of the A-D Converters 12. The outputs of the A-D Converters are read by the Processor at the termination of each A-D Conversion sample of the input phase voltages and line currents. Thus, the samples provided to the Processor 14 are signals representative of the values of instantaneous voltage and current provided to the meter. These voltage and current samples are periodically multiplied in the Processor 14 and integrated over a period of time to generate output pulses designated as WH OUT and VAR/Q OUT pulses to the Electronic Register 22. WH OUT or VAR/Q OUT pulse is generated each time the integrated value achieves a prescribed threshold level for the appropriate calculation (ie, WH and Var/Q). There is a threshold value stored in the digital signal processor as a constant for each of the various meter types selected by the Meter Type Select Logic 18. In the present embodiment there are six different types of meters as will subsequently be described which can be selected by Logic 18. Thus the Signal Processor 14 stores a threshold constant for each of the various types of meters. The rate of WH OUT and VAR/Q OUT pulses to the Register 22 is determined by the threshold value for the particular type of meter selected by Logic 18. A more detailed description of how the WH and VAR/Q OUT pulses are generated will subsequently be described.

Reference is now made to FIG. 2. The basic timing signals for controlling the sequence of operations of the invention are generated by the Clock Generator 16 as shown in FIG. 2. The Clock Generator is comprised of a high precision Oscillator 28 which provides a 4.97 MHZ signal designated MCLK to the Digital Signal Processor (DSP) 14 and to an A-D Clock Generator 30. The Clock Generator 30 divides the 4.97 MHZ clock signal down to a 207 KHZ signal designated ADCLK. The ADCLK signal is provided to the meter analog to digital converters and to a range select for controlling the operations thereof in a manner to be described. The ADCLK signals are also applied to a Time Base Generator 32 which generates a plurality of output timing signals designated FCCLK, RESET, V SAMPLE, and I SAMPLE. The timing relationships of these signals along with the ADCLK signal will be subsequently described in connection with the detailed operational description of the invention.

FIG. 2 also shows a Precision Voltage Reference 34 for generating a plurality of voltage references for use in the electronic meter of the present invention. The manner in which these references are applied will be subsequently described in the detailed operational description of the invention in connection with FIG. 3.

Reference is now made to FIG. 3 which is a detailed logic schematic diagram of the electronic meter of the present invention. However, prior to proceeding with the detailed operational description of the invention, it is believed first advantageous to describe the basic functions and the purpose of the various logic elements and circuits which make up the meter.

The meter of FIG. 3 is illustrated as receiving three phase voltage inputs (Phase 1-Phase 3) from a polyphase power distribution service into a Voltage Scaling and Isolation Circuit 36 associated with each of the individual phase voltage inputs. The Voltage Scaling and Isolation Circuits 36 provide electrical isolation from the power lines and also scales down the various line voltages; for example from 120 volts through 480 volts down to approximately 1.6 volts for input to a voltage multiplexor (VMUX) 38. The voltage inputs designated VSA thru VSC are multiplexed by the VMUX 38 to provide a multiplexed output signal to a Self Check Enable Switch (SW 40). The multiplexing of the VSA through VSC voltage signals through the VMUX 38 is controlled by the timing of three clock pulses VACLK, VBLK, VCCLK which are applied to the VMUX 38 from a Multiplexor Control (MUX Control 42). The manner in which the VMUX is controlled by these latter clock signals will subsequently be described.

The multiplex voltage signals are passed through SW 40 and applied to the input of a Voltage analog to digital (A-D Converter 12'). Each voltage phase signal VSA through VSC, as it is passed through the VMUX 38 and SW 40, is converted during a sample time as controlled by a V SAMPLE signal applied to the A-D Converter to thus generate digital output signals in the form of a digital word shown as bits DVO-DVN at the output of the Converter 12'. The output word from A-D Converter 12' is applied directly as one input to the Digital Signal Processor 14 (DSP) and also to the input of a Voltage In Decode Circuit 44.

The Voltage In Decode 44 continuously monitors each digital voltage sample at the output of the A-D Converter. So long as the magnitude of the digital word, as represented by DVO-DVN, is above a prescribed magnitude or threshold, an output signal VIIN from the Decode 44 will remain at a binary 1 state at the input of the Voltage and Line Frequency Test Circuit 20''. Circuit 20'' forms a portion of the Meter Self Check Logic 20 as previously described in connection with FIG. 1.

Reference is now made to the left bottom corner of FIG. 3 where it is shown that three line currents (Line 1 - Line 3) are applied to three Current Scaling and Isolation Circuits 46. In the preferred embodiment, the Current Scaling and Isolation Circuits 46 each provide electrical isolation from the power line and scales the line currents down to approximately 2 milliamps maximum for input to a Current Multiplexor (IMUX) 48. Typical input currents to the Scaling Circuits 46 can be up to 200 amperes for self-contained meters and up to 20 amperes for transformer-rated meters. Three current test signals ITA-ITC are provided to the self test logic 20'. During self check operation these signals are monitored to test for a failure in any of the Current Scaling and Isolation Circuits 46.

Output current signals ISA through ISC are provided to the input of the IMUX 48 and are multiplexed therethrough in a fashion similar to the VMUX 38 by three clock signals, IACLK, IBCLK and ICCLK from a Current Phase Clock 50. The Current Phase Clock is clocked by the I SAMPLE signal from the Time Base Generator 32 to properly cycle the clock signals IACLK—ICCLK to control the multiplexing of the ISA—ISC signals through the IMUX 48 to thus provide a multiplexed input signal IIN to the input of a Switched Gain Control Circuit 52. The Switched Gain Control 52 comprises a part of the Automatic Range Select 26 and automatically provides a scaled up or scaled down IIN current signal to the input of a Current to Voltage Converter 54. The current signal from the Switch Gain Control 52 gets converted to a voltage signal proportional to the magnitude of IIN in the Current to Voltage Converter 54. This proportional voltage signal gets passed directly to the Current Analog to Digital (A-D) Converter 12'' via a Gain Adjust 56 and a Self Check Voltage Test Switch 58.

The output of the Gain Adjust 56 is a voltage proportional to the input current IIN and is designated as IOUT. This IOUT signal is applied as one input to a Range Select 60, also forming a part of the Automatic Range Select 26 previously described. The Range Select 60 receives the I SAMPLE and ADCLK clock signals from the Time Base Generator 32 and monitors the IOUT signal to thus provide a control signal designated EN16 to the DSP 14 and to the Switch Gain Control 52. The details for the Range Select Circuit 60 will subsequently be described. However for the present, suffice to say that that circuit continuously monitors the magnitude of the IOUT signal and, as the magnitude of that signal changes, the EN16 control signal will cause the Switched Gain Control 52 to scale the input current IIN to the proper level for input to the Current to Voltage Converter 54. As previously mentioned, the purpose of this scaling is to properly scale up the small signal levels of the input current IIN to be more nearly comparable to large signals thus reducing the total range over which the Current A-D Converter 12'' must operate. The EN16 signal from the Range Select 60 is a binary signal which switches between a binary 0 and a binary 1. This signal is monitored by the DSP 14 and is utilized by the DSP to know which scaling is being applied to the input current IIN in order to make the proper calculations when computing the values of watthours and Var/Q hours.

The current A-D Converter 12'' also receives input signals similar to the Voltage A-D Converter 12' and samples signals proportional to the multiplexed input current signals ISA—ISC to thus provide at its output digital words corresponding in magnitude to the respective samples of the analog input current. These digital words are provided on a plurality of lines to the input of the DSP 14 designated as Signals DIO-DIN. As previously mentioned, DSP 14 serves to multiply the respective digital voltage and current samples together to derive instantaneous power at the time of each sample. Each digital sample DVO-DVN and DIO-DIN is clocked into the DSP 14 at the time of generation of the RESET signal from the Time Base Generator 32 (see FIG. 2).

The MCLK high frequency signal from the Oscillator 28 is also provided as the basic master clock for the input to the DSP 14. MCLK allows the DSP 14 to operate at a very high frequency in comparison to the remainder of the meter. This high frequency clocking, which is attributed to the MCLK signal, allows the DSP to process a vast amount of data between analog to digital samples as will subsequently be described.

Still referring to FIG. 3, the Meter Type Select Logic 18 as previously described in connection with FIG. 1 is shown as being comprised of a Type Select 62, a Type Select Decoder 64, a Threshold Decode 66 and the aforementioned MUX Control 42. As previously mentioned, when the meter is connected to the proper phase voltages and line currents for of the particular type of service being monitored, the meter of the present invention can be configured to measure energy in two or three wire single phase circuits or three or four wire polyphase circuits. The manner in which the meter of the present invention can be configured to meter electrical energy from the above mentioned six different circuits is best shown by reference to the following Table 1.

TABLE 1

TYPE SELECT CODING BY METER TYPE

| BIT2 | BIT1 | BIT0 | TYPE DESCRIPTION BY APPLICATION | |
|---|---|---|---|---|
| 0 | 0 | 1 | 3-ELEMENT METER FOR FOUR-WIRE THREE-PHASE WYE SERVICE | TYPE 1 |
| 0 | 1 | 0 | 2-ELEMENT METER FOR FOUR-WIRE THREE-PHASE WYE SERVICE | TYPE 2 |
| 0 | 1 | 1 | 2-ELEMENT METER FOR THREE-WIRE THREE-PHASE DELTA OR THREE-WIRE NETWORK SERVICE | TYPE 3 |
| 1 | 0 | 0 | 2-ELEMENT METER FOR FOUR-WIRE THREE-PHASE DELTA SERVICE | TYPE 4 |
| 1 | 0 | 1 | 1-ELEMENT METER FOR THREE-WIRE SINGLE PHASE SERVICE | TYPE 5 |
| 1 | 1 | 0 | 1-ELEMENT METER FOR TWO-WIRE SINGLE PHASE SERVICE | TYPE 6 |

| BIT3 | DESCRIPTION |
|---|---|
| 0 | SELF-CONTAINED METER |
| 1 | TRANSFORMER-RATED METER |

Table 1 shows the states of four binary bits; Bit 0, Bit 1, Bit 2 and Bit 3. These bits correspond to Bits 0-3 as shown at the output of the Type Select 62 of FIG. 3. As shown in FIG. 3, the Type Select 62 contains four sets of terminal connections which can be jumpered to set up the various binary bit configurations for input to the Type Select Decoder 64 by merely connecting jumpers across the various terminal connections. For example, when a jumper is connected across a particular set of jumper terminals such as shown for Bit 3, then Bit 3 is considered to be a binary 1, whereas in the absence of a jumper, the bit will be a binary 0. As can be seen from Table 1 it takes three unique binary bits, Bits 0-2, to define the six different types of meters by application. In addition a fourth, Bit 3, is required to define whether the particular meter is a self-contained meter or a transformer-rated meter as shown in the second half of Table 1. To configure the meter type for a particular application (ie, service) it can be seen that it is only necessary to connect the appropriate jumpers in the Type Select 62 to achieve the desired configuration. For example as shown in Table 1, if the meter is to be configured as a Type 1 for a four-wire three-phase wye service, Bit 0 will have a jumper connected across its two terminals, whereas Bits 1-2 will be left open. Further, if it is assumed that this Type 1 meter is a self-contained meter, then terminal connections of Bit 3 will likewise be left open. By observation of Table 1 in connection with the Type Select jumpers in Type Select 62 it can be seen how the various other meter types 2 through 6 can be selected.

The requirement to be able to distinguish between a self-contained meter and a transformer-rated meter as set by Bit 3 of the Type Select 62 arises from the evolution of the aforementioned induction type watthour meters where transformer-rated meters generally run at a certain design speed at a test current of 2.5 amperes (out of a full scale of 20 amperes) and self-contained meters run at the same speed at a test current of 30 amperes (out of a full scale of 200 amperes). Ideally, in the present invention, the electronic meter is designed to exactly emulate existing induction type watthour meters by providing watthour output pulses from the DSP 14 at a rate exactly 12 times the speed of the equivalent induction watthour meter disc. Thus it can be seen that the DSP, in order to be able to distinguish between in a self-contained and a transformer-rated meter, must be notified of the magnitude of the input current provided to the meter in order to establish the proper threshold in the DSP 14 to generate the watthour output pulses at the proper rate for that particular input current. The manner in which the DSP 14 distinguishes between transformer-rated and the self-contained meters will subsequently be described.

Still referring to FIG. 3, the Bits 0-3 are applied to the Type Select Decoder 64 wherein they are decoded into four binary Type Select output bits designated TSB0 through TSB3. The Type Select Decoder 64 decodes Bits 0-3 to provide the proper type select bits TSB0 - TSB2 to the MUX Control 42 for decoding therein to effect the proper generation of the Clock Signals VACLK-VCCLK to the VMUX 38.

The MUX Control 42 also receives the current clock signals IACLK-ICCLK from the Phase Current Clock 50. The MUX Control 42 utilizes these latter signals in conjunction with the decoding of the TSB0 through TSB2 signals to control the sequencing of the generation of the VACLK through VCCLK signals which are applied to the VMUX 38. The Mux Control 42 also decodes the TSB0 through TSB2 signals to generate two signals ENB and ENC which are applied as inputs to the Voltage and Line Frequency Test circuit 20". Further, depending on the type of meter configuration, the MUX Control 42 also provides a divide by two signal (÷2) to the DSP 14.

Still referring to FIG. 3, the TSB0 through TSB2 signals, including the TSB3 signal are also provided as inputs to the Threshold Decode Logic 66. This logic decodes those input bits to thus generate three threshold identifier bits TH0, TH1 and TH2 which are applied as inputs to the DSP 14. As will subsequently be described, the DSP decodes these bits to make a determination as to which threshold to utilize for the particular type of meter being configured. In addition, the Threshold Decode 66 decodes bits TSB0-TSB2 to provide two signals ENIB and ENIC to the Current and DSP Self Test Logic circuit 20" to inform that logic of the current inputs utilized for the type of meter configuration being tested.

Reference is now made to a Self Check Switch 68 of FIG. 3. The Self Check Switch 68 is a push button switch which is manually activated, for example, by a meter reader or by a test technician, to apply a ground signal to a Self Check Enable Logic Circuit 70. When the Self Check Switch is closed, the FCCLK clock signal from the Time Base Generator 32 enables the Self Check Enable 70 to generate a Self Check Enable Output Signal shown as SELFCHKEN. As previously mentioned the meter of the present invention has a capability of performing a self check on the operation of the various critical circuits within the meter. Thus when the SELFCHKEN signal is generated, that signal is applied to the Current and DSP Self Test 20', the A-D Converter Test Switch 58, A-D Converter Test Switch 40, the Isolation Circuits 46, and to Threshold Decode Logic 66.

The Current and DSP Self Test 20' includes logic for monitoring the states of the Current Test signals ITA-ITC. During the self check period, that is when SELFCHKEN is high, if any one of the ITA-ITC signals go high (To a binary 1), the IVC TEST signal is generated as an indication that one of the Current Scaling and Isolation Circuits 46 has failed. This IVC TEST signal is provided as one input to the Voltage and Line Frequency Test logic 20" at the top of FIG. 3 and is combined therein with the DSP TEST and the VIOUT signals to generate the SYSTEM FAIL signal from the output of the Voltage and Line Frequency Test 20".

Referring back to the Current and DSP Self Test logic 20', it will be noted that another output signal from that logic is the DSP TEST signal, which is also applied to the Voltage and Line Frequency Test 20". This signal is also generated during the self check enable period in response to the WH OUT pulses which are applied to the Test Logic 20' from the output of the DSP 14. The DSP Self Test Logic 20' includes a timer counter which begins to count upon the receipt of a first WH OUT pulse from the DSP 14. This timer is enabled to begin counting during the period of the SELFCHKEN signal. If the DSP 14 has not generated a second WH OUT signal within a specified window period before the timer times out, the DSP TEST signal will be generated as an indication that the DSP 14 has generated a faulty signal. As previously described, the DSP TEST signal is combined with the IVC TEST and VIOUT signals in the Voltage and Line Frequency Test Logic 20" to generate the SYSTEM FAIL signal. Also this DSP TEST signal may be provided to the Electronic Register 22 or the Indicators 24 as an indication of a DSP failure.

Still referring to FIG. 3, reference is now made to a VAR/Q Select Switch 72. As illustrated, this select switch is a single pole single throw switch, which when closed, applies a ground or logic 0 signal to a Varclock Generator 74 and DSP 14. Varclock Generator 74 also receives as a clock input signal the IACLK signal from the Current Phase Clock 50. The output of the Varclock Generator 74 is a signal designated VARCLK which is applied as another input to the DSP 14. The state of VARCLK is sampled by the DSP, and its state, at the time of sampling, directs the DSP to calculate either Varhours or Qhours. The VARCLK signal is a binary signal which varies in accordance with the state of the Var/Q Select Switch 72. The operation of the Varclock Generator 74 and the manner in which VARCLK is modified in accordance with the state of Switch 72 will become clear in the ensuing description.

Reference is now made back to the Voltage and Line Frequency Test circuit 20". That signal generates a 60 Hertz line frequency output signal designated LFOUT which is provided to the Electronic Register 22 as a timekeeping pulse for that register. The LFOUT signal may also be applied to one of the Indicators 24 to indicate the presence of the 60 Hertz input signal to the meter. The LFOUT signal is also applied to a divide by 32 ($\div 32$) Counter 76 which generates an output signal OFFCLK every 32 cycles of the LFOUT signal. The OFFCLK signal is applied as another input to the DSP 14 and is utilized by the Processor as a flag to cause it to enter into a DC offset subroutine to perform the DC offset compensation previously referred to.

Prior to proceeding with a further detailed description of the invention it is first believed advantageous to provide a brief overall description of the operation of the invention. For this description, let it be assumed that the meter has been configured as a Type 1 for connection to a four wire wye service as shown in Table 1. To adapt the electronic meter of the invention to meter this type of service requires the use of all three current inputs and all three voltage inputs. Still referring to FIG. 3, the current and voltage inputs must be connected such that ISA monitors Line 1, VSA monitors Phase 1, etc. The VMUX 38 and the IMUX 48 must be operated such that VSA is sampled simultaneously with ISA, VSB with ISB, and VSC with ISC. Each pair of samples (eg, ISA and VSA) gets converted to digital words in the respective A-D converters 12' and 12", multiplied in the DSP, summed and accumulated therein to derive a calculation of energy.

In the DSP the multiplication of each set of current and voltage inputs (VSAISA, VSBISB, VSCISC) calculates the power contribution for each phase for each sample taken by the respective A-D converters. The VMUX and IMUX are controlled by the VACLK through VCCLK and IACLK through ICCLK signals to sequentially sample each phase. By sequentially sampling each phase, and adding the products resulting from the multiplication of the current and voltage samples into a common accumulator in the DSP 14 sums together the power contribution of each phase. The accumulation of all power samples over time integrates power into energy. Each time the accumulator equals or exceeds the value set by the aforementioned threshold for the particular meter type selected, one output pulse (WH OUT) is generated and the value of the threshold for that meter type is subtracted from the accumulator. The WH OUT pulse which is generated is proportional to one quantum of energy flowing in the four wire wye circuit being metered in the present example.

For each of the six meter types previously described and as shown in Table 1, appropriate sampling schemes and corresponding threshold values have been established. The following Table 2 shows a sampling sequence which is employed for the various types of meters.

TABLE 2

| SE-QUENCE STATE | SAMPLING SEQUENCE ||||||  |
|---|---|---|---|---|---|---|---|
| | VMUX METER TYPE |||||| |
| | 1 | 2 | 3 | 4 | 5 | 6 | IMUX |
| 1 | VSA | VSA/2 | VSA | VSA/2 | VSA/2 | VSA | ISA |
| 2 | VSB | VSA | $\phi$* | VSA/2 | VSA/2 | $\phi$* | ISB |
| 3 | VSC | VSC/2 | VSC | VSC | $\phi$# | $\phi$# | ISC |
| 4 | VSA | VSA/2 | VSA | VSA/2 | VSA/2 | VSA | ISA |
| 5 | VSB | VSA | $\phi$* | VSA/2 | VSA/2 | $\phi$* | ISB |
| 6 | VSC | VSC/2 | VSC | VSC | $\phi$# | $\phi$# | ISC |
| 7 | VSA | VSA/2 | VSA | VSA/2 | VSA/2 | VSA | ISA |

TABLE 2-continued

| SE- QUENCE STATE | SAMPLING SEQUENCE VMUX METER TYPE | | | | | | IMUX |
|---|---|---|---|---|---|---|---|
| | 1 | 2 | 3 | 4 | 5 | 6 | |
| 8  | VSB | VSC   | φ*  | VSA/2 | VSA/2 | φ*  | ISB |
| 9  | VSC | VSC/2 | VSC | VSC   | φ#    | φ#  | ISC |
| 10 | VSA | VSA/2 | VSA | VSA/2 | VSA/2 | VSA | ISA |
| 11 | VSB | VSC   | φ*  | VSA/2 | VSA/2 | φ*  | ISB |
| 12 | VSC | VSC/2 | VSC | VSC   | φ#    | φ#  | ISC |

*VSB and ISB DISCONNECTED
VSC AND ISC disconnected

The twelve sequence states shown represent twelve sequential samples, where the quantity (eg, VSA) selected by the VMUX 38 is multiplied by the quantity (eg, ISA) selected by the IMUX 48. In Table 2, it will be noted that a zero exists for certain of the voltage and current inputs such as shown for meter types 3, 5 and 6. When these meter types are configured, the respective phase voltages and line currents as shown in Table 2 are disconnected, thus the corresponding voltage and current input signals to the meter are considered as zero. The manner in which the invention handles the sampling of the zero inputs will subsequently be described.

Still referring to Table 2, each of the sequence states 1 through 12 represents a sample of the respective voltage and current inputs for the phases shown (eg, VSA, ISA, etc.). Averaged over 12 sequential samples, it can be shown that average power per sample is as summarized in the following Table 3 for each meter type. Also shown in Table 3 are W, the power per sample in milliwatts; F, the desired output pulse rate (that is of WH OUT); and the corresponding threshold value for each meter type given in milliwatts per pulse. As previously mentioned, these threshold values are stored as constants in the memory of the DSP 14. While each meter type has its own threshold value, it will be noted that meter types 3 and 4 share the same threshold, and meter types 5 and 6 likewise share a common threshold. Thus the DSP need only store three separate threshold values, that is, separate values for meter types 1 and 2, a separate value for meter types 3 and 4, and another value for meter types 5 and 6.

$$\text{Threshold} = 128 \text{ mw/sample} \times \frac{W}{3.45 \times 3.45} \times \frac{17280}{2F} \text{ samples/sec.}$$

$$= \frac{W}{F} \times 92915 \text{ mw/pulse}$$

Where:
W = average power per sample at test condition
F = output pulse rate
17280 samples/sec = sample rate
3.45 Full scale reference voltage of each converter If W were at full scale on current and full scale on voltage, then 128 mW would be added to the DSP accumulator for each sample. The term $W/(3.45 \times 3.45)$ determines what portion of full scale is represented by each sample and in turn, what portion of 128 will be added to the DSP accumulator for the sample. The 2 F term is required because two internal states the DSP are required to generate one output pulse.

The threshold values given in Table 3 are for self-contained meters. To obtain the same output pulse rate, F, at a test current of 250 microamperes instead of the 300 microamperes used for Table 3, (see Notes 1 and 2) involves simply reducing the threshold by the ratio of the test currents, by 5/6 (0.83325). Therefore, as previously explained in connection with Table 1, the fourth type select bit (TSB3) which is used to select self-contained or transformer-rated meters, need only effect a reduction in the threshold value by a factor of 5/6 when a transformer-rated meter is selected.

Continuing now with a further detailed description of the invention, reference is now made to FIG. 4. FIG. 4 is a basic timing diagram illustrating the timing relationships between the various timing signals generated by the Clock Generator 16 as shown in FIG. 2. The ADCLK signal from the A-D Clock Generator 30 is a 207 KHZ clock signal which gets divided down in the Time Base Generator 32 to generate the respective output signals RESET, V SAMPLE, I SAMPLE, and FCCLK. It will be noted that a RESET signal occurs every 12 ADCLK pulses. The interval between the

TABLE 3

| METER TYPE | POWER EQUATION | W MILLIWATTS (NOTE 1) | F PULSE/SEC (NOTE 2) | THRESHOLD MILLIWATTS/ PULSE |
|---|---|---|---|---|
| 1 | $1/3 \, (VSA \, ISA + VSBISB + VSCISC)$ | .480 | 15/9 | 26759 |
| 2 | $1/3 \left( \frac{VSAISA}{2} + \frac{VSAISB}{2} + \frac{VSCISB}{2} + \frac{VSCISC}{2} \right)$ | .320 | 20/9 | 13380 |
| 3 | $1/3 \, (VSAISA + VSCISC)$ | .320 | 15/9 | 17840 |
| 4 | $1/3 \left( \frac{VSAISA}{2} + \frac{VSAISB}{2} + VSCISC \right)$ | .320 | 15/9 | 17840 |
| 5 | $1/3 \left( \frac{VSAISA}{2} + \frac{VSAISB}{2} \right)$ | .160 | 30/9 | 4460 |
| 6 | $1/3 \, (VSAISA)$ | .160 | 30/9 | 4460 |

NOTE 1: Average power per sample at rated voltage (1.6 V) and test current (300 microamperes) @ Unity power factor
NOTE 2: Output pulse rate for conditions of Note 1.

The threshold value for each of the thresholds in Table 3 is calculated as follows:

RESET pulses represents one cycle, or as previously described in connection with Table 2, one sequence state. It will also be noted that the time period between RESET pulses represents one A-D conversion time, the time when each A-D sample is taken and converted. In FIG. 4, for illustrative and explanatory purposes, the VACLK-VCCLK and IACLK-ICCLK signals are shown as being sequentially generated as previously described for a Type 1 meter (see Table 2) for metering energy for a four wire wye service. The voltage and current inputs to the A-D converters 12' and 12" from the VMUX 38 and the IMUX 48 are sampled during each of the VSAMPLE and ISAMPLE pulse times as shown in FIG. 4. This is the input acquisition time of each of the respective A-D converters. When VSAMPLE and ISAMPLE are both at binary 1 states, the VACLK and IACLK signals are applied to the respective multiplexors to switch the respective VSA and ISA input voltage and current signals through the VMUX and IMUX under control of the MUX Control 42 as shown in FIG. 3. This sampling or taking of an A-D conversion of the VSA and ISA input signals is shown as sampling phase A ($\phi$A) in FIG. 4. In a similar fashion, with the generation of each VSAMPLE and ISAMPLE signal, phases $\phi$ B and $\phi$ C are sequentially sampled. As can be seen in FIG. 4, the VACLK and IACLK signals are 17.28 KHZ signals with one complete time frame taking approximately 174 microseconds shown as an overall frequency of 5.76 KHZ. Thus, it can be seen that each sample takes approximately 58 microseconds. At the end of each A-D conversion cycle, the outputs from the A-D converters 12' and 12" (DVO-DVN and DIO-DIN), are read into the DSP 14 (clocked at Reset time) as new current and voltage values shown as IADC and VADC in FIG. 4. The manner in which the DSP 14 processes these values will be subsequently described.

As previously mentioned, the multiplexing of the VSA-VSC voltage input signals through the VMUX 38 of FIG. 3 is controlled by the sequencing of the VACLK-VCCLK signals from the MUX Control 42. The sequence of occurrence of the VACLK-VCCLK signals is determined by a decoding in the MUX Control Type Decode Circuit 42 of the type select bits TSB0-TSB2. The sequence or times of generation of the VACLK-VCCLK signals is dependent upon the meter type which has been configured in the present invention.

FIGS. 5-10 are timing diagrams of the operation of the MUX Control Type Decode 42 for the aforementioned meter types 1-6.

FIG. 5, for example, is a timing diagram of a Type 1 meter as previously described and it will be noted that the timing is similar to that just described in connection with FIG. 4. To achieve the sequential generation of the signals VACLK-VCCLK as shown in FIG. 5 to sequentially multiplex the VSA-VSC signals through the VMUX 38 (FIG. 3) the type select bits TSB0-TSB2 must have the states as shown in FIG. 5. The states of TSB0-TSB2 correspond to the Type 1 meter as previously described in connection with Table 1. Further, it will be noted by referring to Table 2 that the sequential sampling of VSA-VSC by the VACLK-VCCLK signals corresponds to the sequence states as previously described in connection with Table 2. These twelve sequence states are as numbered above the VSAMPLE line in FIG. 5 and FIGS. 6 through 10. It will also be noted in FIGS. 5 through 10 that the sequential timing of the IACLK-ICCLK signals is not altered. As can be seen in FIG. 3, the only input signal to the Current Phase Clock 50 is the ISAMPLE signal which occurs simultaneously with the VSAMPLE signal applied to the MUX Control 42. There are no input control signals or any decode required in the Current Phase Clock 50. Thus it merely generates the signals IACLK-ICCLK sequentially as shown in each of the timing diagrams FIGS. 5 through 10.

Still referring to FIG. 5, it can be seen that during sequence state 1, the VSA and ISA (VA and IA) input signals are simultaneously sampled by their respective A-D converters as controlled by the states of the IACLK-ICCLK signals applied to the IMUX 48 and the VACLK-VCCLK applied to the VMUX 38. In a similar fashion during sequence states 2 and 3, VSB and ISB and VSC-ISC are sequentially sampled.

Reference is now made to FIG. 6 which is a timing diagram for the Type 2 meter showing the generation of the VACLK-VCCLK signals from the MUX Control 42. Reference is also made back to Tables 2 and 3 where it will be noted that for a Type 2 meter, the quantities VSA and VSC must be divided by 2 to derive the proper product in the DSP for the VSA and ISA and VSC and ISC samples. Further, it will be noted as shown in Table 1 that a Type 2 meter is a 2 element meter for a four wire three phase wye service, thus that meter does not monitor the VSB voltage phase input. This non-monitoring is accomplished as shown in FIG. 6 by the decodes of the states of the TSB0 through TSB2 signals in the MUX Control 42. As shown the VBCLK signal is not generated for a Type 2 meter, thus the VSB signal is not multiplexed through the MUX 38. It should be noted, however, that the meter does monitor the ISB current signal applied to the IMUX 48. ISB gets converted simultaneously with either VSA or VSC as shown in FIG. 6.

It is significant at this time to note in FIG. 6 that the decode of the TSB0-TSB2 signals also effects the generation of the $\div 2$ signal from the output of the MUX Control 42 which is applied to the DSP 14. This latter signal notifies the DSP to divide certain of the VSA and VSC samples by two to derive the equations as shown in Table 3.

Reference is now made to FIG. 8 which is a timing diagram of a Type 4 meter. Further, reference is made to Table 1 which also indicates a Type 4 meter is a two element meter similar to Type 2 except it is configured for a four wire three phase delta service. As shown in Table 2 and in FIG. 8 for this type of meter, the VSA input voltage signal gets divided by 2 twice. Once during the first sequence state when VSA and ISA are sampled, and a second time during the second sequence state, when VSA is sampled with ISB.

Reference is now made to FIG. 9 which is a timing diagram of a Type 5 meter. The timing for the Type 5 meter is similar to that as shown for the Type 4 meter except as will be noted in Table 1, the Type 5 meter is a single element meter for a three wire single phase service. In this type of service, there is only one voltage phase, VSA to be monitored. However, there are two current phases, ISA and ISB which get metered. As shown in FIG. 9, VSA gets divided by 2 twice as previously described and shown for the Type 4 meter in FIG. 8. Further, it is significant to note that the input voltage and current signals VSC and ISC are zero by virtue of the fact that those two inputs to the meter are disconnected as noted in Table 2. Thus, during the sequence state 3, when the A-D conversion is taking place, the outputs of the A-D converters 12' and 12" are both zero for VSC and ISC respectively.

Reference is now made to FIG. 10 which is a timing diagram of a Type 6 meter as shown in Table 1, that meter is a single element meter for a two wire single phase service. In this type of meter there is only one voltage phase connected to the meter, and that is VSA. Thus as shown in FIG. 10 and in Table 2, when TSB0-TSB2 are configured to select a Type 6 meter, the VSB, ISB and VSC, ISC conversions are zero which get read into the DSP 14.

Having described the operation of the MUX Control Type Decode 42 in connection with the Decoding of the TSB0-TSB2 signals as shown in FIGS. 5 through 10, it is believed that one using the timing diagrams FIGS. 5 through 10 can readily design the necessary decode logic to generate the VACLK-VCCLK signals in a sequence as shown in those diagrams and as described. It should be noted that when the DSP test is initiated, the SELFCHKEN signal will go high. When SELFCHKEN is high, the MUX Control Type Decode 42 will unconditionally force the ÷2 signal to the DSP 14 to remain low. This will cause the DSP 14 to never divide by two during the DSP test, independent of the particular meter type selected.

Reference is now made back to FIG. 3 to the Threshold Decode 66. As previously described, the Threshold Decode decodes Bits TSB0-TSB3 from the Type Select Decoder 64 to generate threshold decode output signals TH0-TH2 which are transferred to the DSP 14. The following Table 4 shows the logic of the Threshold Decode 66 in equation form. Table 4 also shows how the DSP decodes the TH2 output from the Threshold Decode to make a determination as to whether the configured meter is either transformer-rated or self-contained. This Table also shows how the DSP decodes the TH0 and TH1 outputs from the threshold decode to select the proper threshold in its memory for the particular type of meter that has been selected. It should be noted that when the DSP self test is initiated, the SELFCHKEN signal will go high. When SELFCHKEN is high, the Threshold Decode Logic 66 will unconditionally force TH0 through TH2 signals to go low. This will cause the DSP 14 to select a particular known threshold value for the DSP test, independent of the particular meter type selected. The manner in which the DSP decodes the TH0 through TH2 signals will subsequently be described in connection with the operational description of the DSP.

TABLE 4

THRESHOLD SELECT DECODE LOGIC
FOR METER TYPES 1-6

TH1 = (TSB1 · $\overline{TSB0}$) + (TSB0 · $\overline{TSB1}$ · TSB2)

TH0 = (TSB1 · $\overline{TSB2}$) + ($\overline{TSB0}$ · $\overline{TSB1}$)

| | |
|---|---|
| TH2 = TSB3: | Transformer-rated meter. Reduce selected threshold in DSP by 5/6 (.83325) for particular meter type. |
| $\overline{TH2}$ = $\overline{TSB3}$: | Self-contained meter. Use selected threshold in DSP for particular meter type. |
| $\overline{TH0}$ · $\overline{TH1}$: | Select Threshold (26759) in DSP for Type 1 meter. |
| TH0 · TH1: | Select Threshold (13380) in DSP for Type 2 meter. |

TABLE 4-continued

THRESHOLD SELECT DECODE LOGIC
FOR METER TYPES 1-6

| | |
|---|---|
| TH0 · $\overline{TH1}$: | Select Threshold (17840) in DSP for Types 3 and 4 meters. |
| $\overline{TH0}$ · TH1: | Select Threshold (4460) in DSP for Types 5 and 6 meters. |

The Threshold Decode 66 also decodes Bits TSB0-TSB2 to generate two output signals ENIB and ENIC which are applied to the Current and DSP Self Test logic 20'. The logic for decoding these signals is shown on the following Table 5.

TABLE 5

METER TYPE DECODE LOGIC FOR
IVC TEST

| Types 1 & 5 | Type 2 | Type 4 |
|---|---|---|

ENIB = (TSB0 · $\overline{TSB1}$) + ($\overline{TSB2}$ · $\overline{TSB0}$) + ($\overline{TSB0}$ · $\overline{TSB1}$)

| Types 1, 2, & 3 | Type 4 |
|---|---|

ENIC = ($\overline{TSB2}$) + ($\overline{TSB0}$ · $\overline{TSB1}$)

As can be seen in Table 5, signal ENIB gets decoded as Types 1, 2, 4 and 5 and signal ENIC gets decoded as types 1, 2, 3 and 4. The ENIB and ENIC signals are utilized in the Current DSP Self Test logic 20' only for the testing for the failure of the sensors in the current Scaling and Isolation Circuits 46 as detected by the ITA-ITC signals applied to the Self Test Logic 20'.

When the meter has been configured to one of the types of meters not using or monitoring current ISB or ISC, it is necessary to disable testing of the particular line current input in order to prevent the generation of a false current test. The ENIB and ENIC signals enable the current and DSP self test logic 20' to distinguish between the various types of meters to prevent such generation. The ENIB signal from the Threshold Decode 66 is ANDED in the Self Test Logic 20' with the ITB signal. In a similar fashion, the ENIC signal is ANDED with the ITC signal. When the ENIB signal is enabled, it will allow its corresponding AND gate to be enabled when the ITB signal goes high to detect a failure in the line 2 current sensor. In a similar fashion, when the ENIC signal is enabled it will allow its AND gate to be enabled when the ITC signal goes high to detect a failure in the line 3 current sensor. The outputs of the above mentioned two AND gates are ORED together in an OR gate with the ITA signal in the Test Logic 20' to thus provide an output signal from that gate whenever any one of the ITA-ITC signals indicates a current sensor fail condition. The output of that OR gate serves to generate the IVC TEST signal if there is a failure during the selfcheck period.

Prior to proceeding with a further detailed description of how the IVC TEST signal is generated, reference is now made to FIG. 25 for a description of how the ITA-ITC signals are generated in the Current Scaling and Isolation Circuits 46.

FIG. 25 is a schematic diagram of the Current Scaling and Isolation Circuit 46 for sensing the Line 1 Current of FIG. 3. Similar Circuits 46 are present for Lines 2 and 3 currents.

U.S. patent application Ser. No. 279,161, filed on 12/2/88, entitled Electronic Meter Chopper Stabilization, discloses that portion of the circuit of FIG. 25 comprised of a current transformer (CT), Switches 78, an Operational Amplifier 80 and a Current Multiplexer 48. That application is assigned to the assignee of the present invention and is incorporated herein by reference for a detailed operational description thereof.

As part of the Self Check feature of the present invention, a Switch (SW) 84 and a Comparator 86 have been incorporated into the circuit of FIG. 25. The Switch 84 is operated by the SELFCHKEN signal to inject a Voltage Signal of known polarity into the negative (−) terminal of Amplifier 80 when the meter is in the self check mode. This voltage signal is provided by small current from a Current Source 88 connected between the −VT reference and SW 84.

The output of Amplifier 80 on Conductor 90 to a positive (+) input terminal of a Comparator 86. The negative (−) terminal of Comparator 86 is connected to the +VT reference (see FIG. 2).

The Switches 78 are driven by the FCCLK clock signal at an approximate 154 HZ rate to continuously (alternately) switch the potential of a sense winding Ns at the CT across the positive and negative input terminals of Amplifier 80. The output of Amplifier 8 is fed back through the contacts of Switches 78 to a feedback winding Nf of the CT. This feedback signal, through the Nf winding, nullifies the flux in the core of the CT and reduces the voltage induced in the Ns winding.

The Switches 78 also switch the polarity of the Nf winding at the output of the Circuit 46 to thus provide the aforementioned ISA current to the input of the IMUX 48. The IMUX also receives the current signals ISB and ISC from the respective Current Isolation and Scaling Circuits 46 as shown in FIGS. 25 and 3. The IIN signal is shown in FIG. 25 at the output of the IMUX 48. As previously described, this signal is applied to the Switched Gain Control 52 (see FIG. 3).

Still referring to FIG. 25, let it now be assumed that the SELFCHKEN signal is high (ie, in Test mode) causing SW 84 to apply the ITEST Current signal to Amplifier 80. The magnitude of this signal at the negative input terminal of Amplifier 80 does not have any affect on its operation so long as the Ns or Nf windings are not open. Thus, the output voltage of the amplifier is sufficiently low to prevent turning on Comparator 86.

Let it now be assumed that the Current Sensor (CT) has failed due to an opening in the Ns winding either during or prior to entering into the Self Check mode. With the Ns winding open, its polarity can no longer be switched by Switches 80 across the amplifier input terminals. As a result, the voltage caused by the ITEST current at the negative terminal of Amplifier 80 drives it into saturation causing its output to go positive, thus turning on the Comparator 86. When Comparator 86 turns on its output signal ITA goes positive, thus providing an indication of current sensor failure.

As previously described in connection with FIG. 3, the ITA-ITC signals from the Current Isolation and Scaling Circuits 46 are applied to the Current and DSP Self Test Logic 20' where they are ORED together to generate the IVC TEST signal. Reference is now made back to FIG. 3 for a continued description of the Test Logic 20'.

As previously mentioned, the Current and DSP Self Test logic 20' also generates the DSP TEST signal whenever the DSP 14 fails to generate the WH OUT pulses within a specific time window.

Figure 12:
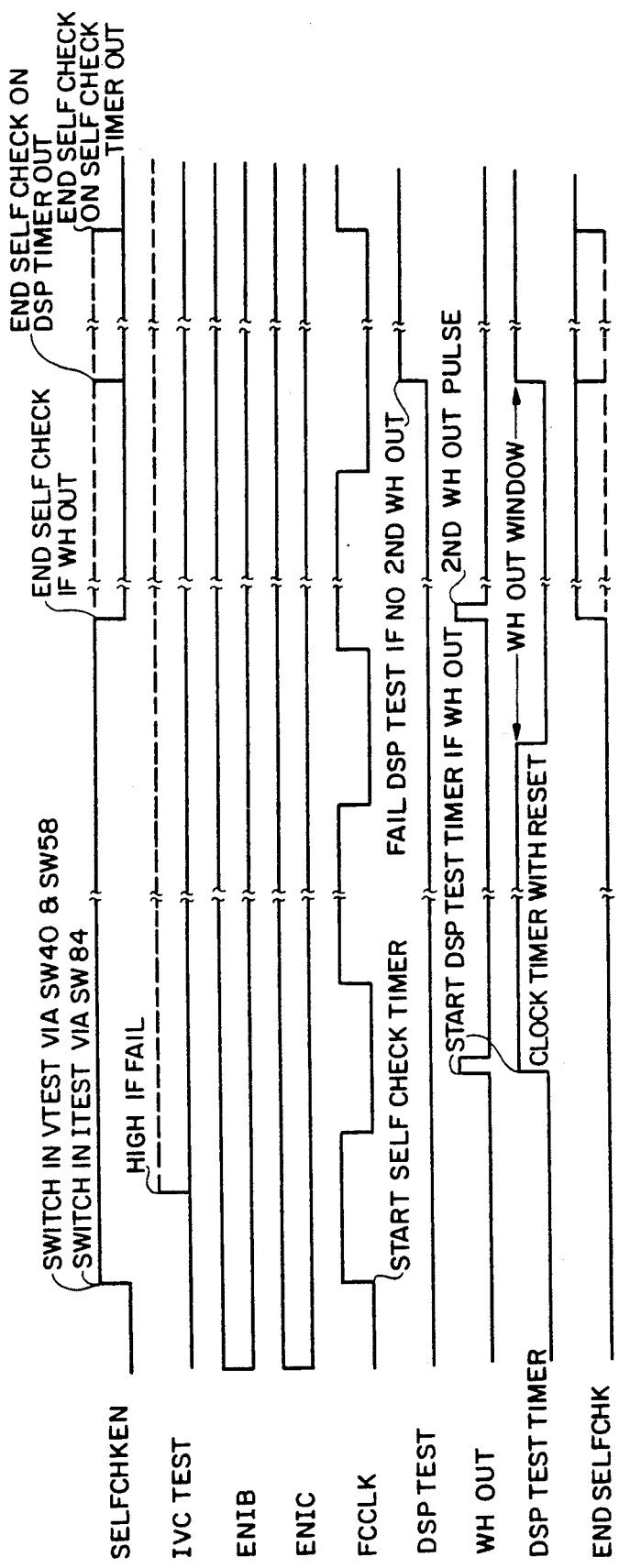
Figure 13:
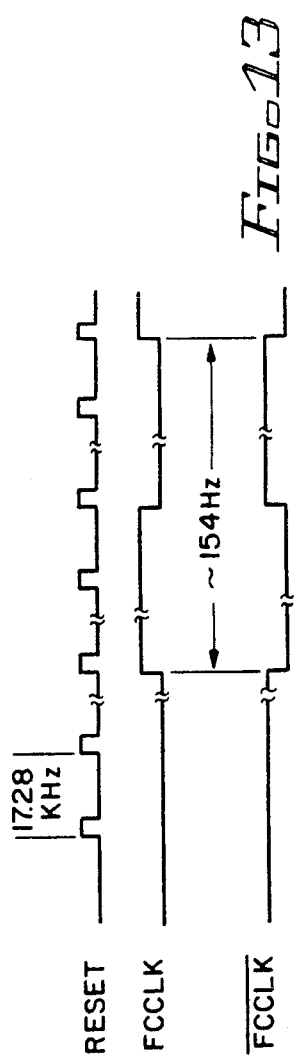

To best understand the operation of the Current and DSP Self Test Logic, reference is now made to FIG. 12. which is a timing diagram of the operation of that logic for the generation of the IVC TEST and DSP TEST signals. Self Check begins when the Self Check Switch 68 is depressed, at which time the SELFCHKEN signal goes high. The SELFCHKEN signal is latched on the rising edge of the FCCLK signal as shown in FIG. 12. The SELFCHKEN signal will remain high for different periods—depending on various conditions to be explained. The states of the ENIB and ENIC signals will be positive or negative according to the type of meter which has been selected by the Threshold Decode 66. The basic equations for the ENIB and ENIC signals are as previously given in Table 5. As previously explained, these signals identify to the Test Logic 20' the current sensor circuits to be tested.

It will be noted that the IVC TEST and the DS TEST signals are both low upon entering the test cycle. During the test cycle, the ITA-ITC signals (see FIGS. 3 and 25) will be tested for failure of a current sensor (CT of FIG. 25). The DSP is also tested by checking for WH OUT pulses from the DSP during the test cycle. The manner in which the DSP generates the WH OUT pulses for DSP Test will subsequently be described.

Reference is now made to FIG. 12 in conjunction with FIGS. 3 and 25. As shown in FIG. 12, when the SELFCHKEN signal goes high, the VTEST signal from the Precision Voltage Reference 34 is switched via Switches SW 40 and SW 58 into the A-D Voltage and Current Converters 12' and 12" as shown in FIG. 3. At this time both converters go through the conversion process as previously described. Also at the time the SELFCHKEN signal goes high, the ITEST current signal as shown in FIG. 25 is switched into the negative input terminal of Amplifier 80 via SW 84. Thus it can be seen that the test current from the—VT reference supply is now applied to the input of Amplifier 80 to test for an open sensor as previously described in connection with FIG. 25.

It will also be noted that the SELFCHKEN signal is applied to the input of the current and DSP Self Test Logic 20' as shown in FIG. 3. Thus at this time, as shown in FIG. 12, the FCCLK pulse starts to clock a Self Check timer inside the DSP Self Test Logic 20'. This timer, not shown, is clocked by FCCLK each time it goes positive.

Upon entry into the test mode, any one of the current sensors in the Current Scaling and Isolation Circuits 46 could have failed prior to entry into the test or one of those sensors could fail during the test. For explanatory purposes, as shown in FIG. 12, on the IVC Test line, it will be noted that the IVC Test signal is shown as going high during the test period thus indicating that one of the current sensors has failed as previously described in connection with FIG. 25. For example, if the current sensor in the Current Scaling and Isolation 46 has failed as previously described in connection with FIG. 25 on the Line 1 current line, the ITA signal will be high and applied to the input of the Current and DSP Self Test Logic 20'. As previously described, the ITA signal is ORED with the ITB and ITC signals in the Self Test Logic 20' to thus generate the IVC TEST signal at the output of the Test Logic 20'. Of course, at the time of the test and during the test, if none of the ITA -ITC signals goes high, there will be no failure detected and thus the IVC TEST signal will remain low as shown in FIG. 12. The IVC TEST signal can come high at any time during the Self Test cycle.

Reference is now made to the DSP TEST line of FIG. 12 wherein it will be noted that the DSP TEST signal will remain low all during the DSP Test cycle. It will be recalled that the A-D conversions began at the very beginning of the Self Check period. As previously described in connection with FIG. 4, and A-D conversion sample only takes approximately 58 microseconds. And at the end of that conversion sample, the outputs of the A-D converters are clocked into the digital signal processor for processing therein. The processor operating in a very high frequency from the MCLK pulse from the Clock Generator 16 can perform many of these A-D conversions in a very short period of time.

If the DSP 14, voltage A-D Converter 12' and Current A-D Converter 12" are operating properly, it will generate a WH OUT pulse as shown in FIG. 12 within a prescribed period of time following the start of the Self Check Test. The DSP Self Test Logic 20' waits for the receipt of the first WH OUT pulse from the DSP 14. However, if the DSP is not operating properly, it may not generate any WH OUT pulse to be detected by the Logic 20'. For explanatory purposes as shown in FIG. 12, the first WH OUT pulse is shown as being generated by the DSP 14 at some time after the beginning of the Self Test cycle. When the first WH OUT pulse is received in the Test Logic 20' as shown in FIG. 12, that pulse starts a DSP Test timer within the Logic 20'. The receipt of this first pulse gets latched into a memory within the Logic 20' to thus allow the DSP timer to be clocked with the RESET pulse. The DSP Timer will continue to count for a prescribed period of time, as shown in FIG. 12, at which time the output of the timer will go negative to establish a WH OUT time window. This time window will last a predetermined period of time until the DSP Test Timer times out by going positive as shown in FIG. 12.

As shown in FIG. 12, a second WH OUT signal is received during the WH OUT window. If the DSP generates this second WH OUT pulse within the window, it is an indication that the DSP and converters are operating properly. Thus, as shown at the top of FIG. 12, the SELFCHKEN signal is driven negative to thus end the Self Check cycle. The Self Check Enable signal, SELFCHKEN, is driven negative as shown in FIG. 12, by an ENDSELFCHK signal generated at this time from the DSP Self Test Logic 20'. This latter signal is applied to the Self Check Enable Logic 70 to thus drive the SELFCHKEN signal negative. On the other hand, if the second WH OUT pulse is not received in the Test Logic 20', the ENDSELFCHK will not be generated and the SELFCHKEN signal will remain high as shown by the dotted line in FIG. 12. Assuming that the second WH OUT signal has not been received, the DSP Timer will continue to be clocked by the RESET pulse until it times out by going positive as shown in FIG. 12. At this time, the DSP TEST signal goes high as shown in FIG. 12 to indicate that the DSP test has failed by virtue of the fact that the second WH OUT signal was not received within the time window. Also at this time, the SELFCHKEN signal is driven negative to end the Self Check at the time the DSP Timer times out and at the same time, stop the Self Check Timer. At this time, of course, the ENDSELFCHK will go positive to thus disable the SELFCHKEN signal in the Self Check Enable Logic 70.

Reference is now made to the SELFCHKEN line of FIG. 12 at the right hand side. There shown is a note that says End Self Check on Self Check Timer out. It will be noted at this point that the SELFCHKEN signal goes negative to end the Self Check. If the Self Check Timer were not allowed to time out, there would be no way to terminate the self check test period in the event that the DSP did not generate any WH OUT pulses. This is due to the fact that if the first WH OUT signal is not received, the DSP Timer will never be started and thus there will never be a DSP Timer time out to terminate the Self Check.

Figure 17:
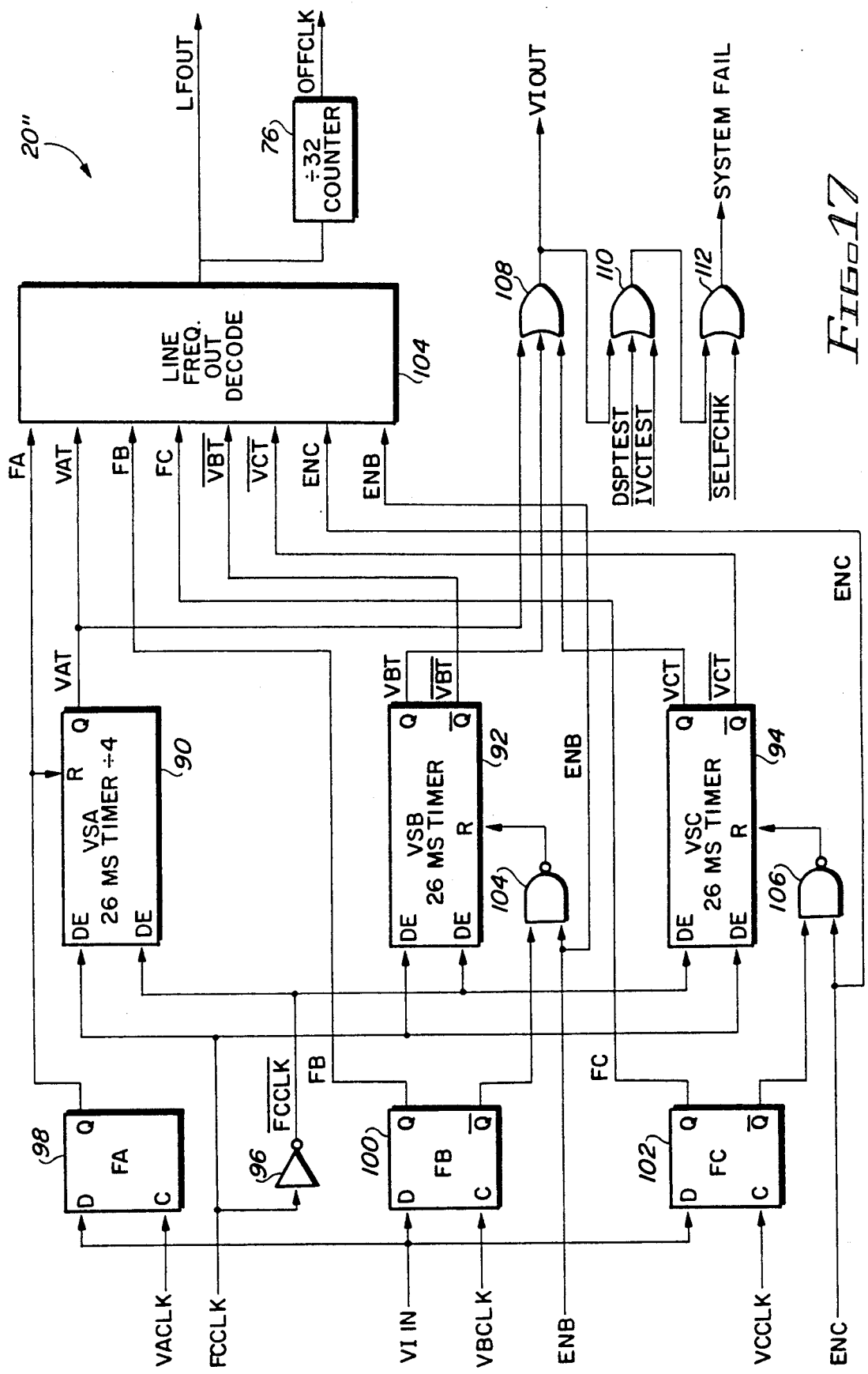
FIG. 17 is a logic schematic of a voltage and system test logic for testing the operation of an electronic meter according to an embodiment of the invention.

The operation of the voltage and Line Frequency Test Logic 20' of FIG. 3 will now be described by reference to FIGS. 11 and 17. Referring first to FIG. 17, it will be noted that the logic of the Voltage and Line Frequency Test Circuit 20" generates all of the aforementioned output signals, LFOUT, OFFCLK (from the +by 32 Counter 76), the VIOUT signal, and the SYSTEM FAIL signal. Further, it will be noted that the input signals VACLK-VCCLK, FCCLK, VIIN, and ENB and ENC, are provided to that logic as previously described in connection with the description of the Voltage and Line Frequency Test Circuit 20" of FIG. 3.

Three 26 millisecond timers, 90, 92 and 94, corresponding to the Voltage Input Phases VSA, VSB and VSC, respectively are provided. These timers are each clocked by the FCCLK signal which is applied to a DE input terminal for each of the timers. The FCCLK signal gets inverted through an Inverter 96 to provide a $\overline{FCCLK}$ signal to one of the DE terminals of each of the timers to cause those timers to be clocked in a conventional counter manner. Three flip-flops 98, 100 and 102, are also provided for controlling the resetting of the Timers 90-94 and further for providing signals FA, FB and FC to a Line Frequency Out Decode Logic 104.

Each of the flip-flops 98, 100 and 102 are clocked by the VACLK, VBCLK, and VCCLK signals respectively. As previously described, the VIIN signal is applied to the Voltage and Line Frequency Test Logic 20" from the Voltage in Decode 44 as shown in FIG. 3. The VIIN signal from the Voltage in Decode 44 is a binary signal which varies between binary 0 and binary 1 dependent upon the magnitude of the word from the Voltage A-D converter during each conversion sample as the input voltages VSA, VSB and VSC are sampled. For example, at the termination of each A-D conversion, the magnitude of the output word from the Voltage A-D Converter 12' will have some binary value representative of and proportional to the magnitude of the Phase Voltage (VSA-VSC just sampled and converted. If the magnitude of this word as decoded by the Voltage in Decode 44 is above a prescribed threshold, the VIIN signal will be positive to thus apply a positive input signal to each of the DE input terminals of the flip-flops 98-102. It will be noted that the VACLK, VBCLK, and VCCLK clock signals are applied to the C or clock input terminal of flip-flops 98, 100, and 102 respectively. Thus it can be seen that each of the flip-flops 98-102 will capture the state of the VIIN signal upon the occurrence of the respective clock signals VACLK-VCCLK applied to those flip-flops.

The $\overline{Q}$ outputs of flip-flops 100 and 102 are applied as one input to two NAND Gates 104 and 106, respectively. Gate 104 receives at its other input the ENB signal and Gate 106 receives at its other input the ENC signal. The ENB and ENC signals are also applied to the Line Frequency Decode 104. The ENB and ENC signals are utilized to either enable or disable the operation of the Timers 92 and 94 depending upon the type of meter which is selected by the MUX Control 42. The following Table 6 provides the logic equations defining the logic for decoding the ENB and ENC signals in the MUX Control 42.

TABLE 6

METER TYPE DECODE FOR VIOUT TEST

Type 1

$ENB = TSB0 \cdot \overline{TSB1} \cdot \overline{TSB2}$

Types 1-4

$ENC = \overline{TSB2} + (\overline{TSB0} \cdot \overline{TSB1})$

Figure 11:
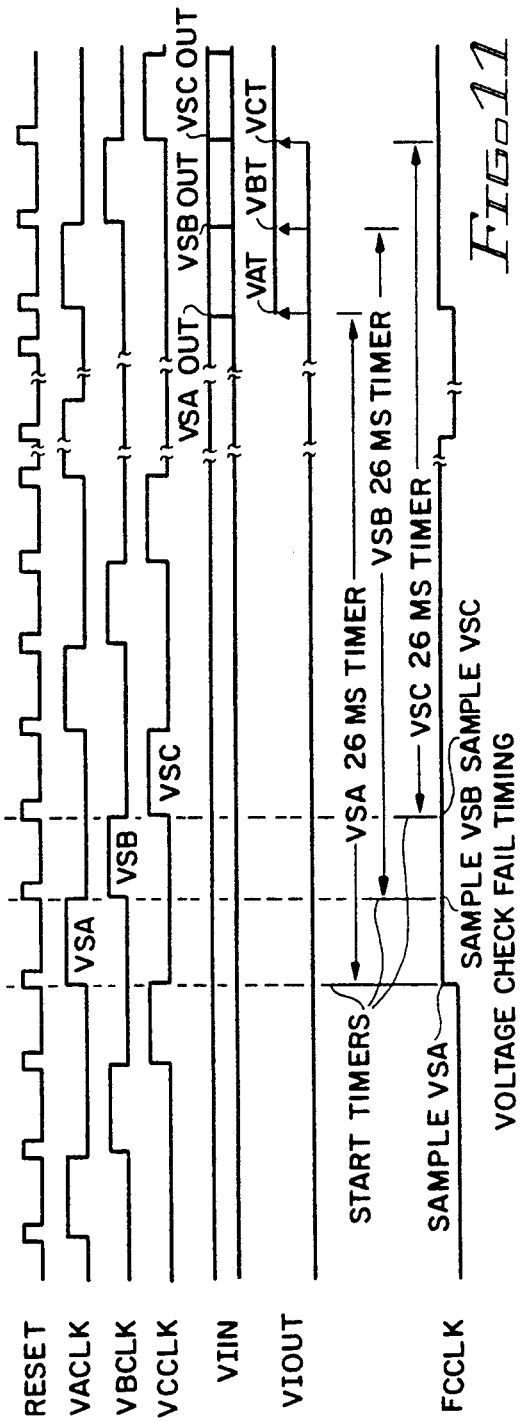

Reference is now made to FIG. 11 which shows that the VIIN signal can be either a binary 1 or binary 0. Assuming that the VSA Phase Voltage input is being sampled upon the occurrence of the VACLK signal and that VIIN is positive, the flip-flop 98 will be set to thus cause its Q output terminal to go positive to a binary 1 to thus apply a Reset signal to the Timer 90, keeping that timer from running. This binary 1 signal is designated as VSA and is also applied to the Line Frequency Out Decode 104. On the other hand, at the time of sampling the VSA Phase Voltage Input, if the VIIN is at a binary 0 or low state, the flip-flop 98 will be reset upon the occurrence of the VACLK signal, thus causing flip-flop 98 to reset. The Q output terminal of flip-flop 98 now goes to a low or binary 0 state, thus removing the Reset signal from Timer 90. As shown in FIG. 11, when the Reset signal is removed from Timer 90, the FCCLK signal will now toggle the Timer 90 to start the timer as shown in FIG. 11. So long as flip-flop 98 remains reset, the Timer 90 will continue to count the FCCLK signals. If the flip-flop 98 is not set before the Timer 90 times out, thus indicating a loss of the VSA input, the Q output from Timer 90 will go to a binary 1 state and generate a VAT signal a shown in FIG. 17 which gets applied to the Line Frequency Decode 104 and also as one input to an OR Gate 108. It will be noted that OR Gate 108 receives three inputs, the VAT input, a VBT input, and a VCT input, the latter two coming from Timers 92 and 94. Thus it can be seen that anytime one of these signals goes to a binary 1 state, OR Gate 108 will be enabled to thus provide a binary 1 VIOUT Voltage Failure signal as previously described and as shown in FIG. 3.

The other Timers 92 and 94 function in the same manner as that just described for Timer 90 in response to flip-flops 100 and 102, monitoring the VSB and VSC voltages in accordance with the phasing of the VBCLK and VCCLK. It is to be noted however, that the Timers 92 and 94 which correspond to the VSB and VSC signals are also controlled at their Reset inputs by the states of the ENB and ENC signals applied to NAND gates 104 and 106. As can be seen from the equations in Table 6, when the ENB signal is a binary 1 or positive, NAND Gate 104 will be enabled to have its output go negative to remove the Reset signal from Timer 92 when the flip-flop 100 is in the Reset state. Of course, as previously described for flip-flop 98, flip-flop 100 will achieve a Reset state at the time of the VBCLK signal if VIIN is at a binary 0 or low state, thus indicating a loss of the VSB input phase voltage. Should this occur, the $\overline{Q}$ output of flip-flop 100 will go to a positive state and with ENB at a positive state, a NAND Gate 104 will be enabled to thus remove the Reset input from Timer 92. Timer 92 will now begin to count the FCCLK pulses in the same manner as previously described for Timer 90. The Timer 94 is reset in the same fashion as described for Timer 92 when the ENC signal is at a binary 1 state.

It can now be seen how if any one of the Voltage Phase inputs VSA-VSB fails for a prescribed period of time as determined by each of the 26 millisecond. Timers 90-94, that the VAT-VCT signals applied to Or Gate 108 will enable that gate to immediately generate the VIOUT signal representative of one of, either a loss of one of the phase voltages, or the possible failure of the Voltage A-D converter. As shown in FIG. 11, each of the Timers 90-94 are started at a time determined by the VACLK-VCCLK signals clocking the respective flip-flops 98-102. Thus it can be seen that each of these timers will be started at different times and thus they will each time out at a later time to generate the respective VAT-VCT signals.

Referring now to FIG. 17, it will be noted that the VIOUT signal is applied as one input signal to an OR Gate 110. It will be noted that other inputs to OR Gate 110 are the DSP TEST and IVC TEST signals from the Current and DSP SelfTest Logic 20'. Thus it can be seen, if the meter fails either the voltage test (VIOUT high), the DSP TEST or the IVC TEST, OR Gate 110 will be enabled to provide a binary 1 high signal as one input to an AND Gate 112. The other input to this latter gate is the SELFCHKEN signal. Thus, when the meter is in the self check mode, Gate 112 will be enabled to generate the SYSTEM FAIL signal if any one of the aforementioned tests fails.

Reference is now made to the Line Frequency Out Decode 104. The logic for Decode 104 is shown in equation form in the following Table 7.

TABLE 7

| LF OUT DECODE LOGIC |
| --- |
| VSA Present      VSA Missing |
| $LFOUT = (\overline{VAT} \cdot FA) + (FB \cdot VAT \cdot \overline{VBT} \cdot ENB) +$ |
| VSA & VSB Missing |
| $(FC \cdot VAT \cdot \overline{VCT} \cdot ENC) \cdot (\overline{ENB} + VBT)$ |

The FA, FB and FC signals from Flipflops 98, 100, 102 are each at a frequency of approximately 60 Hertz. As can be seen from the equations of Table 7, the logic of the Decode 104 is designed such that if the VSA phase voltage is missing, the frequency of the VSB phase voltage (ie, frequency of FB) will be provided as LFOUT from the Decode Logic 104. If neither VSA or VSB voltages are present, the VSC voltage frequency will appear at the output of the Decode Logic 104. Of course, if all of the phase voltage inputs VSA-VSC are missing, the output signal LFOUT will not be present.

Thus it can be seen from the above description of the Line Frequency Out Decode 104 that the LFOUT signal, which gets provided to the aforementioned Electronic Register 22 as a time base signal for that register, will always be provided so long as at least one of the phase voltage inputs VSA-VSC is present at the input of the meter.

Still referring to FIG. 17, reference is now made to the ÷32 Counter 76 in conjunction with FIG. 16 which shows the timing for the OFFCLK signal generated by that counter. As shown in FIG. 16, the Counter 76 divides the LFOUT 60 Hertz signal down by 32 to thus generate a pulse output on each 32 counts of the counter. As previously mentioned in connection with the description of FIG. 3, this OFFCLK pulse is provided to the DSP 14 and is utilized to set a flag in the DSP 14 to notify the processor to enter the update DC Offset subroutine. The manner in which the OFFCLK pulse is utilized in the DSP will subsequently be described.

Reference is now made back to FIG. 3 to the Varclock Generator 74. As previously mentioned the Varclock Generator operates in response to the IACLK signal to generate a repetitively occurring output signal VARCLK which is applied to the DSP 14. The Var/Q Select Switch 72 applies a select signal to the Varclock Generator shown as VAR/QSLCT which is also applied to the DSP 14. Further, as previously described, voltage words in the DSP are delayed by the time equivalent to 90 degrees of the power line frequency before multiplication by the current words. In a similar fashion, when Q is selected by the VAR/Q Select Switch 72, voltage words are delayed by 60 degrees of the power line frequency before multiplication by the current words. In the DSP, products of the current and delayed voltage are separately accumulated until the aforementioned threshold is reached for the particular type of meter selected. The aforementioned output pulses VAR/Q OUT are provided from the DSP 14 to the aforementioned Electronic Register. The VAR/QSLCT signal notifies the processor whether to calculate Varhours or Qhours. The VAR/QSLCT signal modifies the rate of the timing signal VARCLK as shown in FIG. 15. When Varhours are selected (VAR/QSLCT low), VARCLK operates at $\frac{1}{3}$ the frame rate, where the frame rate is as previously described in connection with the timing diagram of FIG. 4. It will be recalled that a frame is the time period required for the multiplexors VMUX 38 and IMUX 48 to sequence through all three of the VSA-VSC, and ISA-ISC inputs once. As shown in FIG. 15, VARCLK operates at $\frac{1}{2}$ the frame rate where Qhours are selected (VAR/QSLCT high).

The DSP 14 samples the VARCLK signal and depending upon its state at the time of sampling will control the time delay of the voltage words. In the DSP memory, there are eight memory locations provided for Phase 1 voltage words (VSA), eight for Phase 2 voltage words (VSB), and eight for Phase 3 voltage words (VSC). Each time the VARCLK signal goes high, a new set of voltage words are loaded into memory, those already in memory are shifted one location and the oldest set of voltage words becomes available for multiplication by its corresponding current word. That is, the oldest word which is the earliest received in the eight memory locations is shifted out of that location and multiplied with its corresponding current word. When Varhours is selected, this delay is twenty-four frames (eight memory locations times the VARCLK at $\frac{1}{3}$ the frame rate) and when Qhours is selected, the delay is sixteen frames (VARCLK at $\frac{1}{2}$ the frame rate). As shown in FIG. 15, the frame rate is $\frac{1}{3}$ the DSP Reset rate, thus resulting in a Varhour delay of 72 DSP cycles and a Qhour delay of 48 DSP cycles. The DSP Reset rate is 17.28 Kilohertz or 288 DSP Reset cycles per 60 Hertz cycle (see FIG. 4.). The Varhour delay of 72 DSP cycles out of 288 cycles is $\frac{1}{4}$. One fourth of 360 degrees is 90 degrees. In a similar manner, the Qhour delay works out to be 60 degrees.

In the DSP there are two integrators, one a watthour integrator for accumulating the sum of the products of the current and phase voltage inputs and a second integrator called the Varhour integrator for accumulating the sum of the products of the input current multiplied by the delayed voltage. Referring to FIG. 15 for example, in the frame when the VARCLK is high, during the first DSP cycle, current ISA is multiplied by voltage VSA and the product is added to the watthour integrator. Then current ISA is multiplied by the delayed voltage, VSA, and then added to the Varhour integrator. The multiplication of ISB, VSB, ISC, VSC, follows as appropriate for the meter type selected. During those frames when the VARCLK signal is low, Varhours (or Qhours) is not calculated.

As previously mentioned, the VAR/QSLCT signal to the DSP notifies the DSP as to whether it is to calculate Varhour or Qhours. A separate threshold is required for each of the calculations of Varhours and Qhours. That is, one threshold is required for the selected meter type when calculating Varhours and another threshold is required for that selected meter type when calculating Qhours. In the DSP these thresholds are calculated by dividing the threshold for the selected meter type by three for Varhour calculations or dividing the threshold for the selected meter type by two for Qhour calculations. The manner in which this is done will subsequently be described in connection with the operation with the DSP 14.

An electric watthour meter is required to have high accuracy over a wide range of values for the metered current. Typically, errors in these meters need to be limited to less than 1 percent of the measured value of energy while measured current may vary over the range of 1 to 200 amperes. Somewhat reduced accuracy is acceptable for currents between 0.1 and 1 ampere. Thus the total range of the input current to the meter is about 0.1 to 200 amperes (a range of 1:2000). The current may be scaled down to smaller values but the dynamic range of 1:2000 still remains. The accurate measurement of a current signal which is 2000 times larger at some times than at others is a difficult problem. This problem is overcome in the present invention by scaling the input current signal to be measured such that minimum current signal levels are more nearly comparable to large current signal levels, thus reducing the total range over which the subsequent measurement circuits in the electronic meter must operate. Further, these subsequent circuits must also be able to compensate properly for the scaling of the input current signal, such that the total result correctly represents the input values. One solution to this problem is described in U.S. Pat. No. 4,761,606 assigned to assignee of the present invention. This patent describes an automatic ranging system which is suitable for analog integrating type electronic watthour meters but that system is not appropriate for digital electronic watthour meters of the type contemplated by the present invention which samples these signals and then processes the digital sample values. Further, the scaling method used in this patent was used with a basic variable scaling technique based on the selection of one of several current transformer windings of different turns counts. This method has the disadvantage of added cost in reduced reliability of the extra windings and interconnections required. Further, the electrical characteristics of the current transformer vary with these turns counts, creating variable electrical characteristics that may be detrimental to circuit operation. The present invention overcomes these disadvantages by providing a method in circuitry which does not require extra secondary windings on the current transformer which would add cost, reduce reliability, require extra interconnects and further cause circuit parametric value changes in the different current ranges.

Figure 18:
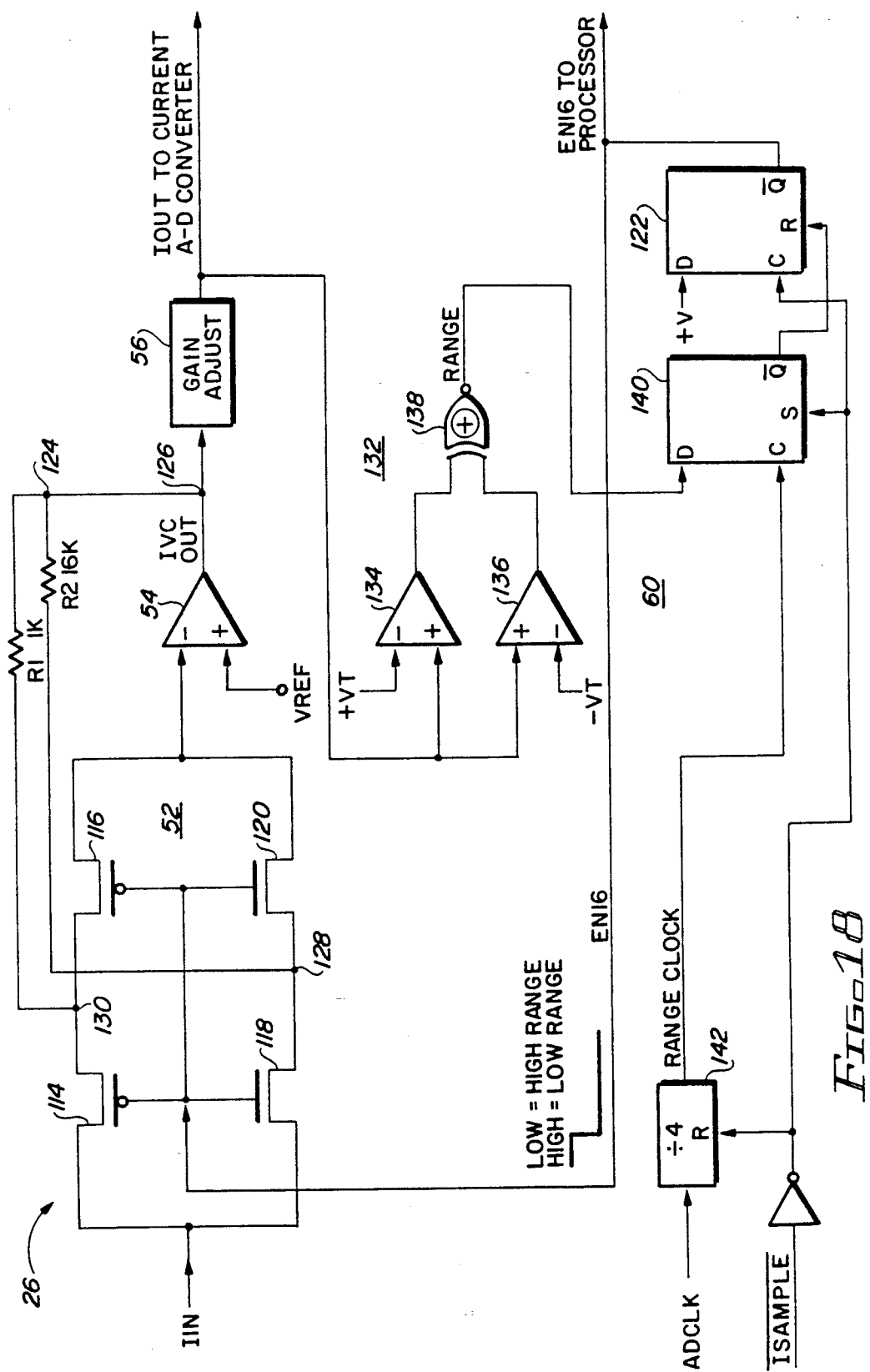
FIG. 18 is a simplified schematic diagram of a range select circuit for automatically scaling the input current applied to an electronic meter including means for notifying a digital signal processor of the range of current selected.

Reference is now made to FIG. 18 which is a schematic diagram of the Automatic Range Select 26 as previously described in connection with FIGS. 1 and 3. The multiplexed input current signals ISA-ISC from the IMUX 48 are provided as the aforementioned IIN signal to the input of the Switched Gain Control shown generally as 52 in FIG. 18. The IIN signal is applied to a plurality of CMOS Transistor Switches 114, 116, 118, and 120. The switching of these transistors is controlled by the aforementioned EN16 signal applied to the gate electrode of each transistor from a Range Select Memory Flip-flop 122. The drain electrodes of Transistors 116 and 120 are connected together, and in turn, connected to negative (−) input terminal of the aforementioned Current to Voltage Converter 54. The Converter 54 has its positive (+) input connected to ground. The input signal IIN gets converted through Converter 54 to a voltage signal proportional to input current as shown at the output by a signal IVC OUT. The IVC OUT signal is applied to the Gain Adjust 56 as previously described in connection with FIG. 3. Two resistors, R1 and R2, are connected together at 124 and further connected at 126 at the output of the Converter 54. The other end of Resistor R1 is connected at the junction of the drain and source electrodes of Transistor Switches 114 and 116 effectively at 130. In a similar fashion, the other end of Resistor R2 is connected at 128 at the junction between the drain and source electrodes of Transistors 118 and 120 respectively.

Reference is now made to the Gain Adjust 56 of FIG. 18 and as further shown in FIG. 3. As they are shown, the IOUT signal is provided to the Current A-D converter via SW 58. Further, the IOUT signal is provided to the input of a Dual Comparator 132 comprised of two Voltage Comparators 134 and 136. The IOUT is applied to the positive (+) input of Comparator 134 and also to the positive (+) input terminal of Comparator 136. The negative (−) input of Comparator 134 is connected to the +VT reference provided by the precision Voltage Reference 34 of FIG. 2. In a similar fashion, the negative (−) input terminal of Comparator 136 is connected to the −VT reference voltage from the Precision Reference Source 34. The output from each of the Comparators 134 and 136 is applied to the input of an exclusive NOR Gate 138 which provides a RANGE signal to the data input terminal of a Flip-flop 140.

The ADCLK and ISAMPLE signals are provided to the range select shown generally at 60 in FIG. 18. The ISAMPLE signal is applied to a reset input (R) of divide by four Counter 142 and to a set (S) input terminal of Flip-flop 140 and also to a input clock terminal (C) of the Memory Flip-flop 122. The ADCLK signal clocks the divide by 4 Counter which generates an output signal designated RANGE CLOCK which is applied to a clock (C) input terminal of Flip-flop 140. Flip-flop 140 has its $\overline{Q}$ output terminal connected to a Reset (R) input terminal of the Memory Flip-flop 122.

Reference is now made to FIG. 14 in conjunction with FIG. 18. As they are shown the RANGE SELECT is activated at each ISAMPLE pulse. Thus it can be seen that a range selection is made for each current sample of the input current IIN appearing at the input of the Switch Gain Control 52. When the ISAMPLE signal goes high as shown in FIG. 14, the ÷4 Counter 142 is reset and simultaneously Flip-flop 140 is set. The data input terminal of the Memory Flip-flop 122 is connected to the +V voltage output from the Precision Voltage 34. Thus the ISAMPLE signal when positive on the clock terminal of (C) flip-flop 122 sets the Memory Flip-flop 122. As shown in FIG. 14, at the time when Flip-flop 122 is set its $\overline{Q}$ output terminal goes negative thus driving the EN16 signal low thus indicating to the DSP 14 that the meter is in the high range condition.

As shown in FIG. 14, when the ISAMPLE signal resets the divide by four Counter 142, that counter begins to count the ADCLK pulses. When Counter 142 times out, it generates a RANGE CLK signal as shown in FIG. 14 which is applied to the C input terminal of Flip-flop 140. At this time, the Flip-flop 140 will capture the binary state output of the range signal from the exclusive NOR Gate 138. If the range signal is low, it will cause Flip-flop 140 to reset, thus causing the $\overline{Q}$ output from Flip-flop 140 to go high and apply a reset signal to the input of the Memory Flip-flop 122. When Flip-flop 122 resets, its output signal EN16 will go positive, thus signalling the DSP 14 that the meter has selected the low range for the input current. On the other hand, at the time that the RANGE CLOCK is generated, if the RANGE signal is high or a binary 1, Flip-flop 140 will remain set as previously established by the ISAMPLE signal, thus the $\overline{Q}$ output from Flip-flop 140 will not change and Flip-flop 122 will remain in the previously established set condition. In this situation, the processor is now notified by the EN16 signal that the meter has remained in the high range for the input current.

To more thoroughly understand the operation of the Range Select 26 of FIG. 18, reference is now made to the IIN signal which is applied to Transistor Switches 114 and 118. As previously described, initially the EN16 signal is low thus forcing the Range Select into the high current range mode. With the EN16 signal low, Transistors 114 and 116 are both driven into conduction to thus allow the IIN current be applied to the negative input terminal of the Amplifier 54. It will also be noted that the conduction of these transistors applies a current through R1 from the IVC OUT terminal of Amplifier 54 which is summed with the IIN current at the junction 130 between Transistors 114 and 116. The sum of this current applies an input signal to the negative input terminal of Amplifier 54, causing Amplifier 54 to generate an IVC signal substantially proportional to the input current IIN. This IVC signal is fed through the Gain Adjust and applied to the positive input terminals of Voltage Comparators 134 and 136. The operation of these comparators is dependent upon the magnitude of the voltage applied to those comparators. The following examples are the best way to explain the operation of Comparators 134 and 136.

Let it be assumed that the input voltage applied to the + input terminals of each of the Comparators 134 and 136 is at a magnitude +2 VT. Under this condition, the +2 VT voltage is greater than the +VT voltage applied to the negative terminal of Amplifier 134, thus its output is at a binary 1. Further, since the +2 VT voltage applied to the + terminal of Amplifier 136 is more positive than the − VT voltage applied to the negative terminal of that amplifier, its output is likewise a binary 1. As a result, the output of the exclusive NOR Gate 138 is at a binary 1, thus placing a set enable signal on the D input terminal of Flip-flop 140. As can be seen in FIG. 14, when the range clock appears, Flip-flop 140 will be set to thus cause this $\overline{Q}$ output terminal to remain negative and not reset the Memory Flip-flop 122. When Flip-flop 122 remains set, its $\overline{Q}$ output terminal will remain low to thus signal to the processor that the meter has selected to remain in the high current range of operation. In addition, the EN16 signal retains Transistors 114 and 116 in conduction and retains Transistors 118 and 120 in their non-conduction condition. As can be seen in FIG. 18, Transistors 118 and 120 remain turned off thus the Resistor R2 is disconnected and Resistor R1 is connected to feed back current therethrough to the junction 130 between Transistors 114 and 116. The IIN current which is applied to the input of Switched Gain Control 52 is proportional to the voltage drop across Resistor R1. Thus the IVC OUT signal from Amplifier 54 is provided through the Gain Adjust 56 to the A-D converter which will convert that current sample to a digital value for input as the current word to the DSP Processor.

Amplifiers 134 and 136 will also work in the manner just described for the +2 VT inputs signal when a −2 VT input signal is applied to the positive terminals of those amplifiers. For example, a −2 VT signal at the + terminal of Amplifier 134 will be more negative than the +VT signal applied to the negative terminal. As a result, the output of Amplifier 134 will be a binary 0. In a similar fashion, the −2 VT signal applied to the + terminal of Amplifier 134 will be more negative than the −VT signal applied to its input terminal. Thus, the output of Amplifier 136 will likewise be a binary 0. As a result, the range output signal from the exclusive NOR Gate 138 will be high as previously described causing Flip-flop 140 to remain set, thus not resetting Memory Flip-flop 122. The EN16 signal remains low as previously described for the +2 VT example.

As previously mentioned, the EN16 signal is always low at the beginning of the Range Select cycle. Thus forcing the Range Select into the high current range mode. Let it now be assumed that at the beginning of the Range Select sampling period, the signal IIN is at a low value which causes the IVC OUT signal applied via the Gain Adjust 56 to the Comparators 134 and 136 to be at a value +½VT. Since the +VT ½ signal is less positive than the +VT signal applied to the negative input terminal of Amplifier 134, the output of that Amplifier will now be a binary 0. Since the +½VT signal applied to the positive terminal of Comparator 136 is more positive than the −VT signal applied to the negative input terminal, the output from Comparator 136 will be a binary 1. Thus it can be seen that the output of the exclusive NOR Gate 138 will cause the RANGE signal to go low and thus apply a reset signal to the D input of flip-flop 140. When the RANGECLOCK times out and clocks Flip-flop 140, it will now reset thus causing a binary 1 reset signal to be applied to the reset terminal of Flip-flop 122. This causes Flip-flop 122 to now reset, thus driving the EN16 signal positive to now force the Range Select into the low range condition. The EN16 signal will now cause Transistors 118 and 120 to conduct thus switching out Resistor R1 and switching Resistor R2 from the IVC OUT output of Amplifier 54 back into the Junction 128 of Transistors 118 and 120. The larger value Resistor R2 will now cause a larger output signal to be generated at the output of Amplifier 54 to compensate for the small current IIN being provided to the range input of the meter and to scale that small current signal up to make it comparable to aforementioned examples where the +2 VT signal was applied to Comparators 134 and 136. Comparators 134 and 136 will operate in a fashion similar to that previously described in response to a −½ VT signal applied to their positive input terminals. If a −½VT signal is applied to both Amplifiers 134 and 136, Amplifier 134 output will be a binary 0, whereas Amplifier 136 will generate a binary 1 output. As a result, the range signal from exclusive NOR Gate 138 will be at a binary 0 to thus force the EN16 signal positive as previously described.

From the foregoing description, it can now be seen by selecting the ratio of R1 to R2 as a power of 2, it becomes simple for the DSP 14 to convert samples taken in one scale to the other scale for combining the quantities of the various samples. In the DSP, as will be described, this is done by an arithmetic shift or divide process of the binary value representing each sample which is taken. In the present embodiment, the ratio of R1 to R2 is 1:16. The dynamic range of the signal seen by the Current A-D Converter 12" is thus reduced by a factor of 16 from 2000:1 down to 125:1. It is to be understood that ratios of R2:R1 other than 16:1 can be used. Ratios which are powers of two have the advantage of easy compensation in a digital circuit for microcomputers. However, more than two ranges may be used. A third range can be added, for example, by use of a third resistor similar to R1 and R2, and another threshold detector in the Range Select Logic 60 to select which of the three resistors is to be used.

Further, it can now be seen from the above description, that the range determination is made by starting in the high current range and switching to the low current range for measurement if the current signal is below a predetermined threshold value. It is to be understood that, alternatively, range determination can be made by starting in the low current ranges, switching to the high current range for measurement if the signal is above a predetermined threshold value.

Figure 19:
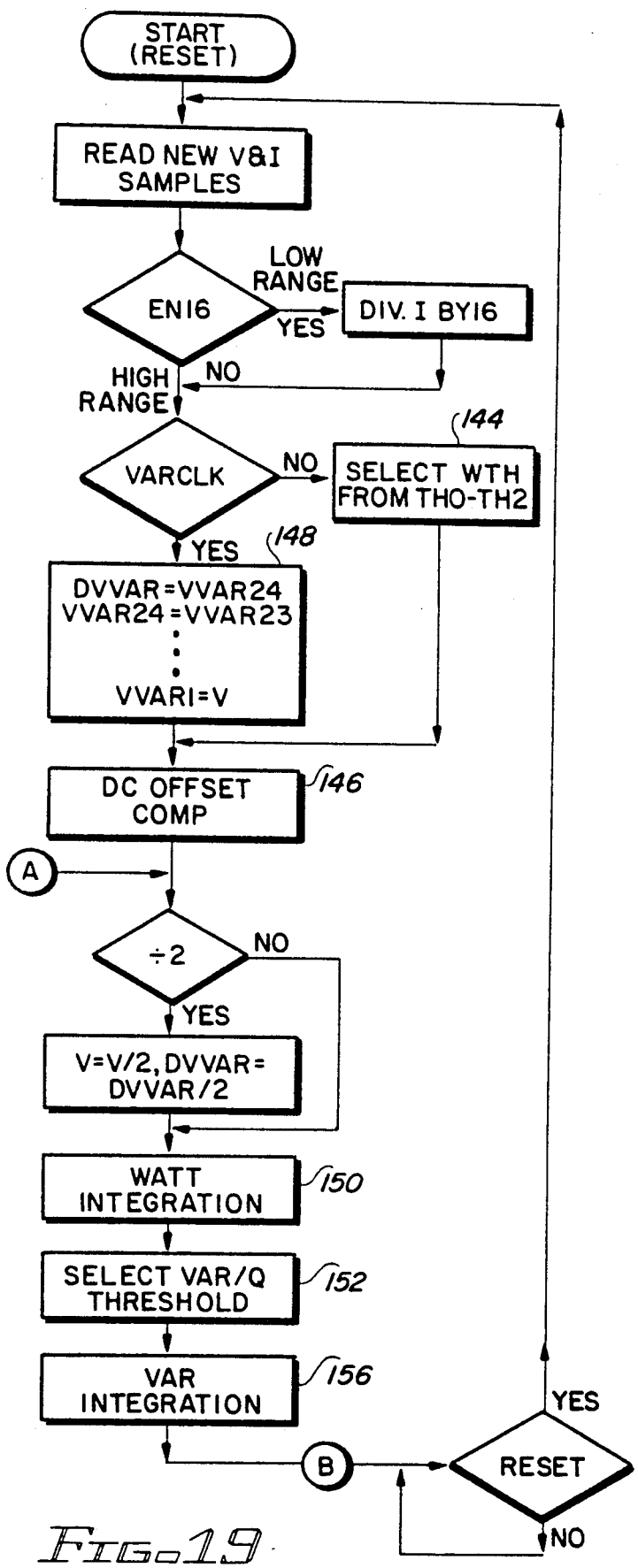

The operation of the DSP 14 will now be described with reference to FIGS. 19 through 24. Reference is first made to FIG. 19 which is an overall flow chart of the program and the method by which the DSP 14 performs the various calculations to ultimately generate the WH OUT and VAR/Q OUT pulses. As a preface to the description of FIG. 19 it is to be remembered that the DSP 14 performs its calculations on a voltage and current A-D conversion sample basis. That is, the DSP reads each A-D converted word from the A-D converters starting at the time of the generation of the RESET pulse from the Timebase Generator 32 as shown in FIG. 2. The DSP will perform all of its calculations in a very rapid manner and then go into a wait cycle waiting for the receipt of another reset signal from the timebase generator to start another cycle.

As shown in FIG. 19 the DSP on the receipt of the RESET signal, enters into a START block from which entry is made into an action block wherein the DSP reads the new or just converted voltage and current words from the A-D converters into the DSP. These new samples designated as V and I are stored in temporary variable locations in the memory of the DSP. The processor then tests to see if the EN16 signal from the Range Select 60 is high or low to determine whether the low range or the high range was used for the input current sample. If the Range Select 60 has selected the low range, the processor will then enter into an action block where it divides the current sample I by 16 and then enters into a VARCLK? decision block. On the other hand if the EN16 signal is low indicating that the range select has selected the high range for the input current sample, exit is made through the No branch of the EN16? decision block and entry is made into the VARCLK? decision block.

The DSP now checks for the presence of the VARCLK signal from the Varclock Generator 75. It will be recalled from the previous description that the DSP will only calculate Varhours or Qhours when the VARCLK signal is at a binary 1 or high. At this sample time, if the VARCLK signal is low, then exit will be made from the No branch of the VARCLK? decision block into a SELECT WTH FROM TH0-TH2 subroutine 144. The SELECT WTH subroutine 144 will subsequently be described. However, its primary purpose is to select the proper threshold of the various thresholds retained in the DSP memory for the meter type selected. Upon completion of the SELECT WTH subroutine, entry is then made into a DC OFFSET COMPENSATION subroutine 146 to be described. As briefly described in the foregoing description, the purpose of the DC OFFSET subroutine is to calculate a offset value to compensate for the DC Offset which takes place in the various voltage A-D converter circuits as previously described.

Reference is now made back to the VARCLK? decision block. Let it now be assumed that the VARCLK signal from the Varclock Generator 74 is positive. As a result the processor exits the Yes branch of the VARCLK? decision block entering into an Action Block 148. Block 148 represents the aforementioned 24 word shift register which is stored in the DSP memory. It will be recalled that there are eight memory locations for each of the voltage phase input signals VSA, VSB, and VSC. These memory locations may function as a push down stack as each new voltage sample V is read, that new voltage sample V is transferred into a location in this stack called VVAR1. As V is loaded into VVAR1, the words in the stack are sequentially pushed down whereby the oldest voltage samples are pushed to the bottom of the stack as shown in 148, whereby the stack location VVAR23 is pushed into VVAR24. It will also be noted that VVAR24 which is the oldest sample in the stack is transferred out into a register location in memory called DVAR which will be used to calculate Varhours for the present sample. It will be recalled from the previous description that the voltage samples V are delayed by either 90 degrees for the calculation of Varhours or 60 degrees for the calculation of Qhours. It can be seen that these two delays occurred in the stack just described in Block 148. The amount of delay of the voltage samples is dependent upon the frequency of occurrence of the VARCLK pulse. It will be recalled from the previous description that when the meter is operating in the Varhour mode that the Varclock signal occurs at a frequency which pushes the Stack 148 down to delay each of the voltage samples to accomplish the aforementioned 90 degree phase delay. Thus, the designation DVVAR represents the delayed voltage sample for Varhour calculations when the meter is in the Varhour select mode. On the other hand, it will be recalled if the meter is in the Q select mode and the occurrence of the VARCLK signal occurs at a frequency to create a delay of the DVVAR samples to accomplish the aforementioned 60 degree shift in the voltage.

Reference is now made back to the output of the DC OFFSET COMPENSATIONS subroutine 146 where entry is made into a ÷2? decision block. It will be recalled from the previous description that the voltage samples of certain types of meters has to be divided by 2 in order to calculate the proper WH OUT and Var/Q OUT pulse rates. It is in this decision block that the DSP tests for the presence of the ÷2 signal from the MUX Control 42. The following Table 8 shows the logic in equation form for the decoding of the ÷2 as done by the Meter Type Decode 42 in FIG. 3.

TABLE 8

METER TYPE DECODE
÷2 LOGIC EQUATIONS

TYPE 2

$\div 2 = (\overline{IBCLK} \cdot \overline{TSB0} \cdot TSB1 \cdot \overline{TSB2}) +$

TYPES 4 & 5

$(VACLK \cdot TSB2 \cdot \overline{TSB1})$

Still referring to FIG. 19, if the ÷2 signal is present, exit is made from the ÷2? block through a Yes branch into an action block wherein the present voltage sample is divided by two. Also at this time, it will be noted that the delayed voltage sample now in DVVAR is also divided by two. If the divide signal is absent, then exit is made from through the No branch of the decision block and entry is made into a WATT INTEGRATION subroutine 150. It is in this subroutine where the DSP multiplies each current and voltage sample (I and V) and accumulates the products of those samples in a watthour integrator to thus derive a value proportional to energy consumption. After completion of the WATT INTEGRATION subroutine 150, entry is then made into a SELECT VAR/Q THRESHOLD subroutine 152. It is in this subroutine where the DSP again tests for the presence of the VARCLK pulse to make a determination as to whether to calculate the proper threshold for Varhours or Qhours. It would be noted in the subroutine 152 that there are two exit points from that subroutine. One of these exits is into a RESET? decision block and the other is into a VAR INTEGRATION subroutine 156. In the subroutine 152, if the VAR CLK signal is not present at the time the test is made, then exit will be into the RESET? decision block wherein the DSP will cycle until a RESET pulse is again generated. Upon receipt of the RESET pulse, the DSP will exit through the Yes branch of the RESET? decision block and reenter back into the input of the READ THE NEW V&I SAMPLES again. On the other hand, if the VAR CLK is present at the time of the test, the VAR INTEGRATION subroutine is entered.

The VAR INTEGRATION subroutine functions similar to that described for the watt integration routine 150. It multiplies the present current sample I by the delayed voltage sample located in DVVAR and places the products of those samples in a voltage integrator wherein the sample products are summed and integrated to derive reactive energy consumption for the generation of the VAR/Q OUT pulses.

Still referring to FIG. 19, reference is now made back to the SELECT WTH subroutine 144. That subroutine is shown in FIG. 20 and reference is made thereto for description thereof. This subroutine is entered upon testing the state of the VARCLK signal. It is in this subroutine that DSP checks the states of the TH0-TH2 signals from the Threshold Decode 66 as shown in FIG. 3. As previously described, the TH0-TH2 signals define the type of meter selected by the present invention. Upon entry into the SELECT WTH subroutine 144, first entry is into a TH1? decision block wherein the state of the TH1 signal is tested. If TH1 is a binary 0, exit is made through a No branch into a TH0? decision block wherein the state of TH0 is tested. If TH0 is a binary 0, exit is made through a No branch of that block indicating that a Type 1 meter has been selected. If a Type 1 has been selected, entry is made into an action block wherein a register memory designated TH is made equal to the threshold value from the constant THRES1 location in memory, designating the threshold for the Type 1 meter. The TH register is a location in memory which is set to the particular threshold value for the meter type selected. Reference is now made back to the TH1? decision block. If TH1 is set, entry is then made into a TH0? decision block wherein the state of TH0 is also tested. If TH0 is set entry is now made into an action block wherein the register TH is set to the constant threshold value THRES2 for a Type 2 meter. On the other hand, if TH0 is not set, exit is made through a No branch into a decision block wherein the TH register is set to the threshold value for meter types 5 and 6.

The TH register is set to the threshold values for Register Types 3 and 4 as shown by the exit from the TH0? decision block earlier described. Once the TH register has been set to the appropriate threshold value, entry is then made into a TH2? decision block when the DSP tests for the state of the TH2 bit from the Threshold Decode 66. It will be recalled that the state of this bit defines to the DSP as to whether the type of meter is a self-contained meter or a transformer-rated meter. If TH2 is set, entry is made via its Yes branch into an action block wherein the TH register is set equal to its present value multiplied by 5/6 (0.83325) to thus reduce the magnitude of the threshold value by 5/6 for a transformer-rated meter. On the other hand, if TH2 is not set the meter is a self-contained meter, therefore no alteration of the threshold is required and entry is made into the DC OFFSET COMPENSATION routine 146.

Figure 21:
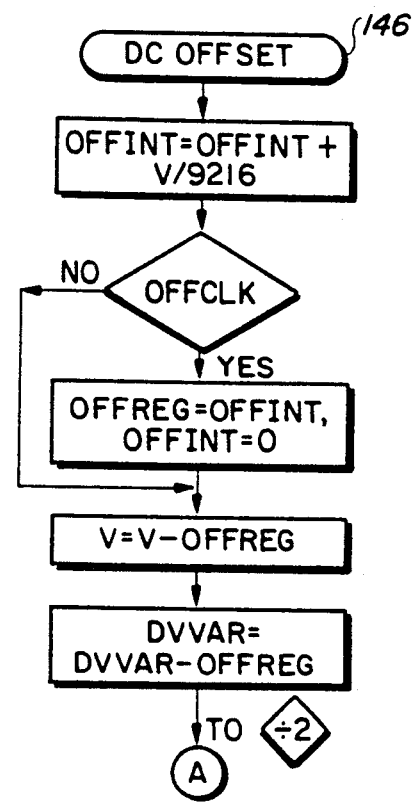

Reference is now made to the DC OFFSET subroutine 146 as shown in FIG. 21. As previously described the purpose of the DC OFFSET subroutine is to compensate for the DC Offset problems previously described in an electronic meter of the type of the present invention. To compensate for DC Offset, the present invention takes advantage of the fact that over an interger number of cycles of 60 Hertz wave form, the average of all samples by the voltage A-D converter 12' must have zero average value. To accomplish this offset compensation, the present invention accumulates the sum of all voltage samples for a fixed number of cycles (32 in the present embodiment), divides the resulting sum of those accumulated samples by the number of samples (9216 in the present embodiment) and subtracts the resulting DC offset per sample from each subsequent voltage sample. In the present embodiment the correction factor, or offset compensation value, is updated every 32 cycles of the 60 Hertz input signal.

Referring now to FIG. 21, upon entering into the DC OFFSET subroutine 146, the DSP enters into an action block wherein an offset integrator register in the memory of the DSP, designated OFFINT, is set equal to OFFINT plus the voltage sample V divided by the aforementioned number of voltage samples 9216. The DSP then tests the condition of the OFFCLK signal from the ÷32 Counter 76 as previously described in connection with FIGS. 16 and 17. If the OFFCLK signal is present, indicating that 32 60 Hertz cycles have passed, exit is then made through the Yes branch into an action block where an offset register OFFREG in the DSP memory is set equal to the value of OFFINT as previously established upon entry into the DC OFFSET subroutine 146. At this time the OFFINT integrator is set equal to zero. On the other hand, if OFFCLK signal is not present upon entry into the DC Offset subroutine, the DSP bypasses the updating of the OFFREG register and exits through the No branch into an action block wherein the compensation adjustment takes place by setting the present voltage sample equal to the voltage sample minus the contents of the register OFFREG as just established.

The delayed voltage sample DVVAR must also be adjusted for DC Offset compensation at this time, thus the DSP enters into an action block where the DVVAR register is set equal to the DVVAR minus the contents of the register OFFREG. The program now exits to the ÷2? decision block at connector A in FIG. 19, wherein the DSP continues to process data as previously described.

Figure 22:
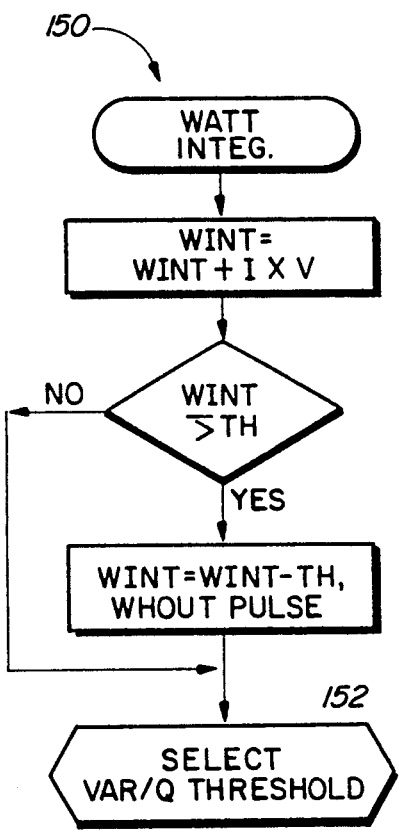
Figure 23:
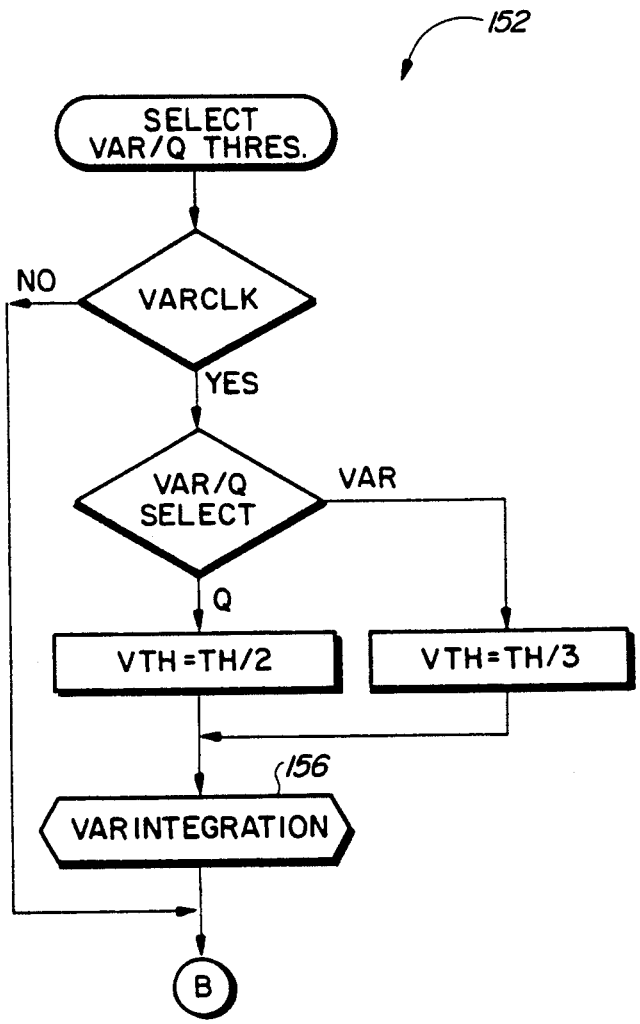

Referring now to FIG. 19, once the processor enters into Connector A from the DC OFFSET subroutine as just described, it proceeds through the +2? decision block in the manner as previously described and enters into the WATT INTEGRATION subroutine 150 shown in FIG. 22. Upon entry into the WATT INTEGRATOR subroutine 150, the DSP enters into an action block wherein a watt integrator or accumulator in the memory of the DSP, WINT, is set equal to WINT plus the product of I and V, the present current and voltage samples. The program next enters into a decision block where a test is performed to see if the contents of WINT is equal to or greater than the contents of the threshold register TH previously established for the selected meter type as described in FIG. 20. If WINT is greater than TH, the program exits through the Yes branch entering into a action block wherein WINT is set equal to WINT minus the contents of the threshold register, TH. It is at this point in the program where the value of the threshold for the particular type of meter selected is subtracted from the value of the integrated current and voltage products. Also in this action block, the DSP generates the output pulse WH OUT. On the other hand if WINT is not equal to or greater than TH, the program exits through the No branch and no output pulse is generated at this time and the program enters into the SELECT VAR/Q THRESHOLD subroutine 152.

Upon entry into the SELECT VAR/THRESHOLD subroutine 152, the first thing the DSP does is check for the presence of the VARCLK pulse. If the VARCLK signal is not present the program exits to connector B wherein it enters into a RESET? decision block where the DSP idles until the RESET signal is received. Once the reset signal is received, the program, as shown in FIG. 19, exits the RESET? decision block through the Yes branch and enters back into the action block where the next voltage and current samples, V and I, are read into the DSP. Referring back to FIG. 23, if the VARCLK signal is present, entry is then made into a VAR/Q SELECT decision block wherein the processor tests the state of the VAR/QSLCT signal from the VAR/Q select switch 72. If Varhours has been selected by switch 72, exit is made through a VAR path into an action block wherein a separate threshold register for Vars, VTH, is set equal to the threshold for the meter type selected, divided by three. The program then enters into the VAR INTEGRATION subroutine 156. Referring back to the VAR/Q SELECT decision block, if the Select Switch 72 specifies that Q is to be calculated, the DSP then exits via the Q branch of that decision block, entering into an action block where the VTH threshold register is set equal to the present threshold value, divided by two. The DSP then enters into the VAR INTEGRATION subroutine 156 which is shown in FIG. 24.

The VAR INTEGRATION subroutine 156 operates in the same manner as previously described for the WATT INTEGRATOR subroutine 150. However in this subroutine, there is a separate integrator, VINT, required for VAR calculations. As shown upon entry into the VAR INTEGRATOR subroutine 156 an action block is entered wherein the integrator VINT is set equal to the VINT plus the value of the present current digital work multiplied by the delayed voltage work DVVAR. A test is next performed to see if the contents of VINT are equal to or greater than VTH, the Var integrator threshold. If VINT is greater than VTH, exit is made through the Yes branch into an action block wherein the VINT is set equal to VINT minus VTH and the DSP outputs the appropriate pulse for either Varhours and Qhours, as previously calculated, on the VAR/Q OUT output of the processor 14 as shown in FIG. 3 The processor now enters into the RESET? decision block at connector B in FIG. 19 wherein the processor waits for another RESET signal, as previously described. Still referring to FIG. 24, if VINT is less than VTH, then the processor does not subtract VTH from VINT and does not provide a VAR/Q OUT pulse and then exits via the No branch back to connector B as just described.

Having described preferred embodiments of the invention with reference to the accompanying drawings, it is to be understood that the invention is not limited to those precise embodiments, and that various changes and modifications may be effective therein by one skilled in the art without departing from the scope or spirit of the invention that is defined in the appended claims.

What is claimed is:

1. A meter, comprising:
   (a) means for processing current and voltage values proportional to current and voltage samples from conductor means;
   (b) converter means for providing, to said processing means, the current value proportional to samples of current flowing in the conductor means and the voltage value proportional to the voltage of the conductor means;
   (c) multiplexer means for providing, to said converter means, samples of an analog signal proportional to current from the conductor means and samples of an analog signal proportional to voltage from the conductor means; and
   (d) type select means for selectively configuring said meter as one of a plurality of types of meter configurations, said select type means comprising,
   (i) first clock means for providing, to said multiplexer means, a plurality of first clock signals to selectively effect the transfer, into said converter means, of current samples from the conductor means in accordance with a selected type of meter configuration;
   (ii) second clock means for providing, to said multiplexer means, a plurality of second clock signals to selectively control the sequence of sampling voltage on the conductor means to selectively effect the transfer of voltage samples into said converter means, the sequence of sampling voltage, and the transferring thereof, being in accordance with the type of meter configuration selected.

2. A meter in accordance with claim 1 wherein said type select means further comprises means for providing digital signals representative of the type of meter configuration selected, and decode means for decoding said digital signals to modify the sequence of sampling voltage in accordance with the type of meter configuration selected.

3. A meter in accordance with claim 1 wherein said means for processing comprises a digital signal processor means programmed to integrate the products of current and voltage values provided thereto from said converter means, said digital signal processor means further programmed to generate output pulses proportional to electrical energy consumption.

4. A meter in accordance with claim 3 wherein said type select means further comprises means for providing a divide control signal to said processing means to direct said processing means to divide specified voltage values corresponding to prescribed voltage samples taken from the conductor means by a prescribed number according to the type of meter configuration selected.

5. A meter in accordance with claim 1 further comprising self test means for testing for the presence of voltage applied to the meter from the conductor means, and said type select means further comprising means for providing enable type decode signals to said self test means to effect the testing thereby of voltages from the conductor means applicable to the type of meter configuration selected.

6. A meter in accordance with claim 1 wherein said type select means further comprises means for specifying whether the type of meter configuration selected is a self-contained meter or a transformer rated meter.

7. A meter in accordance with claim 3 wherein said type select means further comprises means for providing, to said digital signal processor means, threshold decode signals representative of the type of meter configuration selected, a prescribed threshold value for each of the selectable types of meter configurations being pre-determined and provided to said processing means, and the processor means, in response to said threshold decode signals, selecting the threshold value for the type of meter configuration selected for comparison with the magnitude of the integrated products of said current and voltage values to generate an output pulse proportional to electrical energy consumption when the magnitude of the integrated products is at least equal to the threshold value for the type of meter configuration selected.

8. A method of operating a meter to generate a measurement of reactive energy, the meter comprising converter means for converting analog signals proportional to current flow in, and voltage across conductor means to current and voltage words respectively having values proportional to the instantaneous magnitudes of the samples current and voltage, said method comprising the steps of:
(a) sampling, repetitively, current and voltage words from said converter means;
(b) placing, at prescribed intervals at the time of sampling, a voltage word in delay means;
(c) checking the output of the delay means at each sampling;
(d) increasing the value of integrator means by a value proportional to the product of the last sampled current word and a delayed voltage word from the delay means;
(e) comparing the present value of the integrator means with a prescribed threshold value, the prescribed threshold value being determined based on a pre-selected meter configuration;
(f) repeating steps (b) through (e) until the value of the integrator means is at least equal to the prescribed threshold value; and
(g) generating a pulse representative of a quantum measurement of reactive energy, the quantum of measurement being a function of time that it takes a voltage word to pass from its input to its output.

9. A method in accordance with claim 8 further comprising the step of configuring said meter as one of a plurality of selectable meter configurations.

10. A method in accordance with claim 8 further comprising the steps of, subsequent to sampling current and voltage words, integrating the products of corresponding samples of current words and undelayed voltage words and generating a pulse representative of a quantum of energy, the pulse being generated when the value derived from integrating the products is at least equal to a predetermined threshold.

11. A method in accordance with claim 8 further comprising the step of selectively changing the prescribed intervals whereby the voltage words are placed in the delay means at different prescribed intervals to thereby alter the delay of voltage words passing through the delay means to effect the integration of more than one type of reactive measurement.

12. A type select means for a meter, the meter comprising processing means for processing current and voltage values proportional to current and voltage samples from conductor means, and sampling means for providing, to said processing means, the current value proportional to samples of current flowing in the conductor means and the voltage value proportional to the voltage of the conductor means, said type select means comprising:
first clock means for providing, to said sampling means, a plurality of first clock signals to selectively effect the transfer of current samples from the conductor means in accordance with a selected type of meter configuration; and
second clock means for providing, to said sampling means, a plurality of second clock signals to selectively control the sequence of sampling voltage on the conductor means to selectively effect the transfer of voltage samples in accordance with the type of meter configuration selected.

13. A type select means in accordance with claim 12 further comprising means for providing digital signals representative of the type of meter configuration selected, and decode means for decoding said digital signals to modify the timing of the sequence of sampling voltage.

14. A type select means in accordance with claim 13 wherein the processing means of the meter comprises a digital signal processor means programmed to integrate the products of current and voltage values provided thereto from said sampling means, said digital signal processor means further programmed to generate output pulses proportional to electrical energy consumption.

15. A type select means in accordance with claim 14 wherein said type select means further comprises means for providing a divide control signal to said processing means to direct said processing means to divide specified voltage values corresponding to prescribed voltage samples taken from the conductor means by a prescribed number according to the type of meter configuration selected.

16. A type select means in accordance with claim 15, further comprising means for providing, to said digital signal processor means, threshold decode signals representative of the type of meter configuration selected, a prescribed threshold value for each of the selectable types of meter configurations being pre-determined and provided to said processing means, and the processor means, in response to said threshold decode signals, selecting the threshold value for the type of meter configuration selected from comparison with the magnitude of the integrated products of said current and voltage values to generate an output pulse proportional to electrical energy consumption when the magnitude of the integrated products is at least equal to the threshold value for the type of meter configuration selected.

* * * * *